US009438202B2

(12) United States Patent (10) Patent No.: US 9,438,202 B2
Reinhardt et al. (45) Date of Patent: Sep. 6, 2016

(54) ACOUSTIC STRUCTURE COMPRISING AT LEAST ONE RESONATOR AND AT LEAST ONE COINTEGRATED CAPACITOR IN ONE AND THE SAME PIEZOELECTRIC OR FERROELECTRIC LAYER

(71) Applicant: COMMISSARIAT A L'ENERGIE ATOMIQUE ET AUX ENERGIES ALTERNATIVES, Paris (FR)

(72) Inventors: Alexandre Reinhardt, Saint Martin D'Heres (FR); Julie Abergel, Grenoble (FR); Jean-Baptiste David, Grenoble (FR)

(73) Assignee: Commissariat A L'energie Atomique et aux Energies Alternatives, Paris (FR)

( * ) Notice: Subject to any disclaimer, the term of this patent is extended or adjusted under 35 U.S.C. 154(b) by 60 days.

(21) Appl. No.: 14/040,163

(22) Filed: Sep. 27, 2013

(65) Prior Publication Data

US 2014/0085020 A1 Mar. 27, 2014

(30) Foreign Application Priority Data

Sep. 27, 2012 (FR) ..................................... 12 59071

(51) Int. Cl.
*H03H 9/15* (2006.01)
*H03H 9/54* (2006.01)
(Continued)

(52) U.S. Cl.
CPC ................. *H03H 9/54* (2013.01); *H03H 3/04* (2013.01); *H03H 9/0542* (2013.01); *H03H 9/175* (2013.01);
(Continued)

(58) Field of Classification Search
CPC ......... H03H 2009/02173; H03H 2009/02188; H03H 2009/02196; H03H 2009/02204; H03H 9/0542; H03H 9/173; H03H 9/174; H03H 9/175; H03H 9/542; H03H 9/564; H03H 9/566; H03H 9/587; H03H 9/588; H03H 9/589; H03H 9/60; H03H 9/54; H03H 9/585; H03H 3/04; H03H 2003/0464

USPC ......................................... 333/187, 188, 189
See application file for complete search history.

(56) References Cited

U.S. PATENT DOCUMENTS 5,446,306 A * 8/1995 Stokes et al. ................. 257/416
6,472,954 B1 * 10/2002 Ruby et al. .................... 333/133
(Continued)

FOREIGN PATENT DOCUMENTS

| FR | 2974691 A1 | 11/2012 |
| JP | 2005-311511 | * 11/2005 |
| WO | 01/78230 A1 | 10/2001 |

OTHER PUBLICATIONS

A. Frederick et al., "Frequency Tuning of Film Bulk Acoustic Resonators", Proc. of SPIE, 2006, vol. 6172, 8 pages, 617203-1 thru 617203-8.
S. Gevorgian et al., "DC Field and Temperature Dependent Acoustic Resonances in Parallel-Plate Capacitors Based on SrTiO3 and Ba0.25Sr0.75TiO3 Films: Experiment and Modeling", Journal of Applied Physics, 2006, vol. 99, 124112-1 thru 124112-11, published online Jun. 30, 2006.
(Continued)

*Primary Examiner* — Barbara Summons
(74) *Attorney, Agent, or Firm* — Baker Hostetler LLP

(57) ABSTRACT

An acoustic structure, comprising at least one acoustic resonator exhibiting at least one resonant frequency in a band of operating frequencies and an integrated capacitor, further comprises: a stack of layers, comprising at least one active layer of piezoelectric material or of ferroelectric material; the resonator being frequency tunable and being produced by a first subset of layers of the stack comprising the at least one active layer and at least two electrodes; the integrated capacitor being produced by a second subset of layers comprising the active layer and at least two electrodes; the first and second subsets of layers being distinguished by a modification of layers so as to exhibit different resonant frequencies.

23 Claims, 17 Drawing Sheets

(51) Int. Cl.
*H03H 9/52* (2006.01)
*H03H 3/04* (2006.01)
*H03H 9/05* (2006.01)
*H03H 9/17* (2006.01)
*H03H 9/58* (2006.01)
*H03H 9/02* (2006.01)

(52) U.S. Cl.
CPC ............. *H03H 9/542* (2013.01); *H03H 9/585* (2013.01); *H03H 9/589* (2013.01); *H03H 2009/02188* (2013.01); *H03H 2009/02204* (2013.01)

(56) References Cited

U.S. PATENT DOCUMENTS

| | | | |
|---|---|---|---|
| 6,583,688 B2* | 6/2003 | Klee et al. | 333/188 |
| 6,653,913 B2* | 11/2003 | Klee et al. | 333/188 |
| 6,809,604 B2* | 10/2004 | Kawakubo et al. | 331/107 A |
| 7,084,718 B2* | 8/2006 | Nakamura et al. | 333/133 |
| 7,459,990 B2* | 12/2008 | Wunnicke et al. | 333/133 |
| 7,586,391 B2* | 9/2009 | Volatier et al. | 333/188 |
| 7,675,388 B2* | 3/2010 | Cardona et al. | 333/133 |
| 8,009,407 B2* | 8/2011 | Leidl et al. | 361/311 |
| 2002/0021192 A1* | 2/2002 | Klee et al. | 333/187 |
| 2002/0186102 A1 | 12/2002 | Gamo | |
| 2004/0140869 A1 | 7/2004 | Marksteiner et al. | |
| 2009/0289526 A1 | 11/2009 | Sinha et al. | |
| 2011/0316649 A1 | 12/2011 | Link et al. | |
| 2013/0106243 A1 | 5/2013 | Reinhardt et al. | |

OTHER PUBLICATIONS

M. Desvergne, et al., "RF Lamb Wave Resonators in Bandpass Delta-Sigma Converters for Digital Receiver Architectures," IEEE Northeast Workshop on Circuits and Systems, 2007, pp. 449-452, IEEE.

Rui Yu et al., "Bandpass Sigma-Delta Modulator Employing SAW Resonator as Loop Filter," IEEE Trans. On Circuits and Systems I: Regular Papers, Apr. 2007, pp. 723-735, vol. 54, No. 4, IEEE.

X. Wang, et al., "A Bandpass Sigma-Delta Modulator Employing Micro-Mechanical Resonator," Proceedings of the 2003 International Symposium on Circuits and Systems, 2003, pp. 1-1041-I-1044, IEEE.

T. O. Salo et al., "80-MHz Bandpass $\Delta\Sigma$ Modulators for Multimode Digital IF Receivers", IEEE Journal of Solid-State Circuits, 2003, vol. 38, No. 3., pp. 464-474, Mar. 2003.

K. S. Van Dyke, "The Piezo-Electric Resonator and its Equivalent Network", Proc. IRE, 1928, vol. 16., pp. 742-764.

O. Shoaei et al., "Design and Implementation of a Tunable 40 MHz-70 MHz Gm-C Bandpass $\Delta\Sigma$ Modulator", IEEE Trans. on Circuits and Systems II: Analog and Digital Signal processing, 1997, vol. 44, No. 7., pp. 521-530, Jul. 1997.

P. Muralt et al., "Is There a Better Material for Thin Film BAW Applications Than AlN?", IEEE Ultrasonics Symposium Proceedings, 2005, pp. 315-320.

A. A. Shirakawa et al., "Design of FBAR Filters at High Frequency Bands", International Journal of Rf and Microwave Computer-Aided Engineering, 2007, vol. 17, pp. 115-122, published online Dec. 8, 2006 in Wiley InterScience (www.interscience.wiley.com).

* cited by examiner

ACOUSTIC STRUCTURE COMPRISING AT LEAST ONE RESONATOR AND AT LEAST ONE COINTEGRATED CAPACITOR IN ONE AND THE SAME PIEZOELECTRIC OR FERROELECTRIC LAYER

CROSS-REFERENCE TO RELATED APPLICATION

This application claims priority to foreign French patent application No. FR 1259071, filed on Sep. 27, 2012, the disclosure of which is incorporated by reference in its entirety.

FIELD OF THE INVENTION

The present invention pertains to acoustic components for the analogue processing of electronic signals, and most particularly to resonators and filters exhibiting very low losses as well as great compactness.

BACKGROUND

Currently, the circuits included in wireless communication systems must be capable of managing numerous modes of operation. With the escalation in communication standards, communication terminals must be capable of using the most appropriate available network, whatever the physical location. Communications standards differing with regard to aspects such as the modulation of the signal or the width of the channels, the circuits must exhibit great flexibility.

This flexibility is most naturally afforded through the digital processing of the signal performed by virtue of DSP (Digital Signal Processing) in which various algorithms can be implemented in the form of programs and thus chosen freely by the system itself as a function of the conditions of use. By contrast, the analogue part of the circuits is more specific to a given task, and more difficult to adapt to various conditions. This is why systems designers choose to convert the signals into the digital domain as soon as possible. To this end, the signal can be digitized in intermediate frequency (that is to say after a first conversion of the carrier frequency of the signal from the radiofrequency domain—that is to say from 700 MHz to 2.5 GHz—to frequencies of the order of a few tens to a few hundreds of MHz) as described in the article by T. O, Salo, S. J. Lindfors, T. M. Hollman, J. A. L. Järvinen and K. A. I. Halonen, 80-*MHz bandpass ΔΣ modulators for multimode digital IF receivers*, IEEE. J. of Solid-State Circuits, vol. 38, No. 3, p. 464 (2003) rather than in baseband (after removal of the signal carrier).

A bandpass ΔΣ modulator carries out this analogue-digital conversion of a high-frequency signal with a high resolution, making it a good candidate for direct digitalization into intermediate frequency.

A bandpass ΔΣ modulator carries out a conversion of a high-frequency analogue signal to digital with a high resolution, and solely on a narrow frequency band, thereby rendering it particularly suited to the digitization of a modulated signal. Moreover, the sampling operation can also be used to decrease the frequency of the signal a second time. This makes it possible to decrease the constraints placed on the clock frequency of the modulator, which without this ought to operate at least at three or four times as high a frequency as the intermediate frequency envisaged. After conversion to the digital domain, the signal is converted digitally into baseband and demodulated.

Bandpass ΔΣ modulators are customarily limited by low quality coefficients and non-linearities introduced by the resonators based on LC discrete passive elements or using a transistor coupled to a capacitor (Gm-C). To alleviate these limitations, it has been proposed to use quartz resonators, electromechanical resonators as described in the article by X. Wang, Y. P. Xu, Z. Wang, S. Liw, W. H. Sun, L. S. Tan, *A bandpass sigma-delta modulator employing micro-mechanical resonator*, Proceedings of the 2003 International Symposium on Circuits and Systems (ISCAS'03), p. I-1041 (2003), surface acoustic wave resonators (R. Yu and Y. P. Xu, *Bandpass Sigma-Delta modulator employing SAW resonator as loop filter*, IEEE Trans. On Circuits and Systems I: Fundamental theory and applications, vol. 54, p. 723 (2007), or indeed even Lamb wave resonators (M. Desvergne, P. Vincent, Y. Deval and J. B. Bégueret, *RF Lamb wave resonators in bandpass delta-sigma converters for digital receiver architectures*, IEEE Northeast workshop on Circuits and Systems (NEWCAS 2007), p. 449 (2007)), which are distinguished by their quality coefficients of the order of 1000. The diagram of such a converter is given in FIG. 1, it more precisely entails a reception system using a bandpass analogue-digital converter, and including a resonator M(s) on the circuit.

All these components exhibit an electrical response which as a first approximation can be approximated by the so-called Butterworth-Van Dyke (BVD) diagram as described in the article by K. S. Van Dyke, *The piezo-electric resonator and its equivalent network*, Proc. IRE, vol. 16, p. 742 (1928) and represented in FIG. 2 illustrating this diagram equivalent to an electromechanical or acoustic resonator.

Intrinsically, components of this type exhibit variations of the phase of their admittance ranging from 90° (capacitive behaviour before resonance and after antiresonance) to −90° (inductive behaviour between resonance and antiresonance), as illustrated in FIG. 3, with two zero-crossings of the phase, the first at resonance and the second at antiresonance. Thus, two feedback loop tuning conditions are possible, thereby leading to an instability of the circuit (M. Desvergne, P. Vincent, Y. Deval and J. B. Bégueret, *RF Lamb wave resonators in bandpass delta-sigma converters for digital receiver architectures*, IEEE Northeast workshop on Circuits and Systems (NEWCAS 2007), p. 449 (2007)). To avoid this, and to get back to a resonator exhibiting the same transfer function as a resonator of customary LC type, it is necessary to compensate the static capacitance $C_1$ represented in FIG. 2, of the resonator.

The compensation of the static capacitance of the resonator can be done by constructing a capacitor bridge such as illustrated in FIG. 4. This circuit exhibits in practice the equivalent of a negative capacitance $C_c$ placed in parallel with each resonator. In order that the compensation be complete, it may therefore be necessary for the capacitance $C_c$ to be matched with the static capacitance $C_1$ of the resonator. The transfer function illustrated in FIG. 5 is then generated, which now exhibits only a single resonance.

From a practical point of view, the production of sigma-delta modulators is prone to manufacturing dispersions, which are manifested by dispersions in the value of the static capacitance $C_1$ of the resonator. At the present time, the production of such a circuit with a capacitance exactly matched with the static capacitance of the resonator remains problematic. More generally, this type of problem arises in the case where there is a need to resort, in a circuit composed of heterogeneous elements (that is to say each using a different technology), to capacitance values which must be rigorously matched with capacitance values encountered in other modules of the circuit. The solution generally adopted is to resort to a sorting of the components by values and to assemble together only those which have close values, or to use variable elements making it possible to compensate for drifts. All these solutions turn out to be expensive since at the minimum they require electrical tests of parts of the circuit in the course of manufacture or assembly in order to evaluate the necessary correction.

In the case of the filter mentioned previously, in addition to variations in the capacitance values, the manufacturing dispersions also induce variations in the operating frequency. Elements for adjusting the operating frequency are therefore customarily added to the circuit. This can be done by modifying the frequency of the oscillator defining the operating frequency of the circuit.

By pushing this idea further, it has even been proposed to utilize the frequency tunability of a bandpass analogue-digital converter to include the operation of channel selection within the converter. Just where a channel selection filter, characterized by a narrow bandpass but a large rejection, was placed before the analogue-digital converter, it has been proposed to remove it and to use the resonator of the converter as filtering element as described in the article by O. Shoaei and W. M. Snelgrove, *Design and implementation of a tunable 40 MHz-70 MHz Gm-C bandpass ΔΣ modulator*, IEEE Trans. on Circuits and Systems II: Analog and Digital Signal processing, vol. 44, p. 521 (1997), thereby making it possible to simplify the reception architecture.

Ultimately, a direct conversion of the radiofrequency signal has even been envisaged recently, so as to allow still greater simplification of the architectures, since the mixer used to carry out the operation of decreasing the frequency of the carrier is removed in this case also. In this case, it is the filtering element inserted into the loop of the analogue-digital converter which selects the useful channel. In order for this to be achievable, it is necessary to render the resonator frequency-agile.

A means of rendering resonators frequency-agile consists in using materials whose elastic properties can vary as a function of a DC electric field that it is possible to apply as a supplement to the radiofrequency signal, as illustrated in FIG. 6. The best materials available hitherto are those of the perovskite crystalline family, and notably $Ba_xSr_{1-x}TiO_3$ (BST), which is the best candidate therefor, as described by S. Gevorgian, A. Vorobiev and T. Lewin, *DC-field and temperature dependent acoustic resonances in parallel-plate capacitors based on SrTiO3 and $Ba_{0.25}Sr_{0.75}TiO_3$ films: experiment and modeling*, J. Appl. Phys. 99, 124112 (2006), making it possible to obtain a relative variation of resonant frequency approximating 6%. This type of material suffers, however, from a major defect: the dielectric properties of this material also depend on the applied static electric field, thereby causing variations of the static capacitance of the resonator which are concomitant with frequency variations, as illustrated in FIG. 7.

This makes it problematic to compensate the static capacitance of the resonator, since it is necessary to be able to ensure at any moment that the capacitances of the compensation circuit of FIG. 4 are matched perfectly with the static capacitances of the resonators. With respect to the first problem area of matching capacitance values despite manufacturing dispersions, this precise case is compounded with an additional difficulty on account of the variability during operation of the elements considered. It is therefore necessary to be able to ensure that the components to be matched exhibit the same initial dispersions, but also the same variations during operation. At the present time, no solution to this problem has been afforded.

In the absence of a solution to this second problem, other types of tunable resonators, not exhibiting the variation of static capacitance as a function of frequency excursion, have been proposed in the literature. It has for example been proposed in the patent application from the authors R. Sinha, L. R. Carley, D. Y. Kim, Devices having a tunable acoustic path length and methods for making the same, patent 2009/0289526 A1, to produce a composite resonator, using a piezoelectric layer (for example of AlN) connected to the radiofrequency circuit (and therefore not exhibiting any impedance variations), adjoined with an agile material, such as BST, linked to a DC voltage generator intended to modify its effective elastic properties. Such a structure is represented in FIG. 8. The agility being obtained only indirectly by a modification of the speed of propagation of the acoustic waves (of the order of 1% for BST) in only part of the resonator, the resonant frequency variations that may be expected therefore remain relatively modest.

A possibility of achieving a larger frequency variation consists in utilizing another physical mechanism: a modification of the conditions at the electrical limits applied to a piezoelectric film (by connecting the film to an exterior variable capacitance for example) makes it possible to envisage relative variations in frequencies proportional to the coefficient of electromechanical coupling of the waves utilized, as described in the article: A. A. Frederick, H. H. Hu and W. W. Clark, *Frequency tuning of film bulk acoustic resonators*, Proc. of SPIE, vol. 6172, p. 617203 (2006).

For an AlN/AlN composite resonator, this makes it possible at best to envisage relative frequency variations of 3%, that is to say half as much as BST resonators. The use of materials possessing piezoelectric properties far superior to AlN, such as for example $LiNbO_3$ or $KNbO_3$ would in theory make it possible to envisage relative frequency variations of 25%, but to date these materials remain difficult to integrate into composite resonators (P. Muralt, J. Antifakos, M. Cantoni, R. Lanz and F. Martin, *Is there a better material for thin film BAW applications than AlN?*, 2005 Ultrasonics Symposium Proceeding, p. 315 (2005)).

Whatever the physical mechanism employed in the last two types of variable resonators, even if these structures exhibit a constant value of static capacitance whatever the frequency excursion, nonetheless it is necessary, with a view to the use of these resonators in the filter of a filtering analogue-digital converter, to use compensation capacitors whose value is rigorously equal to the static capacitance of the resonator, thus leading to the first stated problem.

For composite structures using two piezoelectric layers such as represented in FIG. 9, the driving of the frequency is done by way of a variable capacitor whose value must be adjusted relatively with respect to the capacitance of the adjusting layer (the lower piezoelectric layer in FIG. 9), as illustrated by FIG. 10. One of the means of precisely driving components of this type consists in producing a bank of switched capacitors so as to toggle the output of the lower piezoelectric layer to a capacitance equal to $xC_{tpl}$, where x is a factor that may be greater or less than 1 (for example, x lies between $1/100$ and 100) and $C_{tpl}$ the capacitance created by the frequency tuning layer. In order for this to be possible without the introduction, through technological dispersions or environmental variations, of a shift between the values necessary for the driving of the resonator and those provided by the capacitor bank, it is also necessary to match the capacitances of the bank to those of the resonator tuning layer. This type of component therefore generates a third problem area: being capable of providing capacitances that always remain proportional to a reference capacitance, whatever the manufacture drifts or the drifts in the capacitance values encountered during the operation of the circuit.

SUMMARY OF THE INVENTION

In this context, the subject of the present invention is a solution consisting in co-integrating capacitors with acoustic resonators by forming them on the basis of the same ferroelectric or piezoelectric film as the resonator or its tuning part. This is indeed the most direct means of solving the three problems mentioned hereinabove:

- by producing the capacitor using the same ferroelectric or piezoelectric layer as that used to form one of the elements of the resonators, it is ensured that the drifts in the thickness of the deposition are carried over in an identical manner to both components and thus induce identical capacitance variations (if the geometries of the electrodes are identical) or proportional capacitance variations (for different geometries);
- likewise, any variation of the dielectric permittivity of the material used (caused by variations of temperature, of stress or of electrical voltage) impacts both the resonator portion considered and the capacitor, which once again is manifested by identical or at least proportional variations in the capacitance values between the two elements.

This simple concept comes up against a major obstacle however: by producing a resonator, the technological stack is dimensioned in such a way as to ensure that the resonator exhibits an acoustic resonance precisely at the working frequency. A capacitor produced on the basis of the same structure therefore also exhibits these resonances, and does not therefore behave as a simple capacitor.

This is why in this context, the present invention relies more precisely on producing a capacitor on the basis of the ferroelectric or piezoelectric film on the basis of which the resonator is formed, but while making a local modification to the stack of layers used for the production of the resonator and of the compensation capacitor, doing so in order to shift the frequencies of the resonances of the capacitor outside of the range of working frequencies by adding locally (or conversely by removing locally) one or more layers which exist moreover in the stack.

The stack of layers can comprise a passivation layer, a mass overload layer, an encapsulation layer, or even an over-metallization. These elements not affecting the dielectric properties of the film, they do not disturb the value of the capacitance, but only the mechanical resonances.

Advantageously, it is also possible to lower the amplitude of the spurious resonances thus created by decreasing their quality coefficient. This can be performed by removing the acoustic insulation inserted between the resonator and the substrate (formation of a membrane or of a Bragg mirror), or by adding a mass overload produced on the basis of a material of very poor acoustic quality.

Generally, operating in this manner comes up against the prejudice according to which the capacitor does not behave as a simple capacitor, but as a circuit approximated as a capacitor placed in parallel with a certain number of series L-C branches, each of these branches corresponding to an acoustic resonance. Designers may therefore fear that the presence of inductors in this equivalent diagram perverts the operation of the circuit with respect to the use of a capacitor. Nonetheless, the detailed description of the present patent application hereinafter accentuates that it does nothing of the kind, and notably in the case of a circuit for compensating the static capacitance of a resonator.

Thus according to the present invention, by producing matching capacitors on the basis of the same ferroelectric or piezoelectric films as resonators, and by using the same geometries, it is thus ensured that the resonators and the capacitors exhibit the same capacitance values whatever the technological drifts (dispersions of thicknesses from one plate to the other, or on one and the same plate), or whatever the conditions of use (operating temperature, bias voltage, etc.) of the components. This is most particularly worthwhile in a circuit for compensating a static capacitance, since this makes it possible to ensure that a filter such as that represented in FIG. 4 always ensures the compensation.

More generally, this principle can be applied to any circuit for which it is desired to produce capacitors exhibiting variations identical to those of the capacitor of co-integrated electromechanical resonators.

Thus and more precisely, the subject of the present invention is an acoustic structure comprising at least one acoustic resonator exhibiting a so-called transduction zone and at least one resonant frequency in a band of so-called operating frequencies and an integrated capacitor, characterized in that the said acoustic structure comprises:

- a stack of layers, comprising at least one active layer of piezoelectric material or of ferroelectric material;
- the said resonator being frequency tunable and being produced by a first subset of layers of the said stack comprising the said at least one active layer and at least two electrodes;
- the said integrated capacitor being produced by a second subset of layers comprising the said active layer and at least two electrodes;
- the said first and second subsets of layers being distinguished by a modification of layers so as to exhibit different resonant frequencies.

According to a variant of the invention, the resonator formed by the first subset of layers comprises:

- a first transduction zone exhibiting a first active layer of piezoelectric material or of ferroelectric material and at least two electrodes and
- a second so-called frequency-tuning zone exhibiting a second active layer of ferroelectric material and at least two electrodes;
- the active layer of the capacitor formed by the second subset of layers is the first or the second active layer of the resonator.

Thus, the frequency tunability is obtained by the use of a ferroelectric active layer, thereby making it possible to obtain this tunability without the use of exterior elements and thus to have a cointegrated structure.

According to a variant of the invention, the said acoustic structure comprises:

- a stack of layers, comprising at least one active layer of ferroelectric material;
- the said resonator comprising at least the said active layer of ferroelectric material to ensure frequency tuning;
- the said integrated capacitor being produced by a second subset of layers comprising at least the said active layer of ferroelectric material and at least two electrodes.

According to a variant of the invention, the said acoustic structure comprises:

- a stack of layers, comprising at least one first layer of ferroelectric material and a second active layer of piezoelectric material;

the first subset of layers of the said stack forming the said resonator comprising at least the first layer of ferroelectric material so as to ensure frequency tuning;

the said integrated capacitor being produced by a second subset of layers comprising at least the said second layer of piezoelectric material and at least two electrodes.

According to a variant of the invention, the said first active layer is separated from the said second active layer by an insulation layer.

According to a variant of the invention, the at least two electrodes of the resonator and/or the at least two electrodes of the capacitor are in one and the same plane or in parallel planes.

According to a variant of the invention, the stack of layers is situated on the surface of a substrate.

According to a variant of the invention, the first subset of layers comprises means for confining the acoustic waves in the resonator.

According to a variant of the invention, the acoustic structure comprises means for attenuating spurious acoustic resonances in the said second subset of layers.

According to a variant of the invention, the attenuation means comprise in the second subset of layers, at least one layer able to absorb the acoustic waves.

According to a variant of the invention, the means for confining the acoustic waves in the resonator comprising a Bragg mirror structure, the second subset of layers does not comprise this structure for producing an attenuation of the said spurious acoustic resonances.

According to a variant of the invention, the first subset of layers comprises a membrane structure situated under the active layer or layers of the said resonator so as to form a resonant cavity.

According to a variant of the invention, the acoustic structure comprises means of frequency-driving of the resonator which are linked to the electrodes of the resonator tuning zone and to the electrodes of the integrated capacitor.

According to a variant of the invention, the value of the integrated capacitor is equal or proportional to the value of the capacitance exhibited by the resonator tuning zone.

According to a variant of the invention, the ferroelectric material is BST.

According to a variant of the invention, the piezoelectric material or materials of the first layer and/or of the second layers is (are) AlN.

According to a variant of the invention, the said structure comprises an upper passivation layer, that may be made of $SiO_2$.

According to a variant of the invention, the modification of the stack in the second subset is produced in the said passivation layer.

According to a variant of the invention, the electrical insulation layer is made of $SiO_2$.

According to a variant of the invention, the upper electrodes of the active layer in the first subset and in the second subset being produced in one and the same metallic subset of layers, the said modification of the stack in the said second subset is produced by an over-metallization of the said metallic subset.

According to a variant of the invention, the acoustic structure comprises a bridge structure comprising two resonators coupled electrically to two integrated capacitors.

According to a variant of the invention, the electrodes of the transduction zone of the resonator and the electrodes of the capacitor are produced in the same layer or layers of the stack and exhibit the same geometry.

It is pointed out that the advantage of ferroelectric materials such as BST for example resides in their abilities to have frequency-tunable acoustic properties. Nonetheless, such an advantage may be qualified by the fact that these are materials generally exhibiting highly nonlinear properties, generating distortions on the electrical signal in the RF circuit.

This is why, it may be beneficial to dissociate the frequency-tunability and compensation capacitor part by combining the use of a part dedicated to the acoustic resonator based on piezoelectric material intended to be connected to the RF circuit and a part based on ferroelectric material intended to be placed under DC voltage for the frequency tunability.

BRIEF DESCRIPTION OF THE DRAWINGS

The invention will be better understood and other advantages will become apparent on reading the non-limiting description which follows and by virtue of the appended figures among which:

FIGS. 15a to 15l illustrate the various steps for producing a first exemplary acoustic structure, with FIG. 15l being a variation of the step shown in FIG. 15h, according to the invention;

DETAILED DESCRIPTION

Exemplary Acoustic Structure According to the Invention

A frequency-agile resonator is produced on the basis of a film of BST inserted between a lower platinum electrode and an upper ruthenium electrode, and overlaid with a silica passivation layer.

In order to insulate this resonator from the substrate, the structure comprises a Bragg mirror based on an alternation of tungsten and silica layers W/SiO$_2$ composed of 5 layers, and dimensioned according to the procedure proposed in the patent application of S. Marksteiner, G. Fattinger, R. Aigner and J. Kaitila, Acoustic reflector for a BAW resonator, patent US 2004/0140869 A1.

The thickness of the BST layer is fixed at 240 nm for technological reasons while the thicknesses of the passivation layer and of the electrodes are determined so as to provide a resonance at the desired frequencies, and to produce tuning capacitors, such as set forth hereinafter. The thicknesses of the layers making up this resonator are given in the second column of Table 1 hereinbelow:

TABLE 1

|  | Resonator | Capacitor (exemple1) | Capacitor (example 2) |
| --- | --- | --- | --- |
| Metallization reinforcements | — | — | 1 µm |
| Passivation (SiO$_2$) | 420 nm | — |  |
| Upper electrode (Pt) |  | 220 nm |  |
| Ferroelectric film (BST) |  | 240 nm |  |
| Lower electrode (Pt) |  | 200 nm |  |
| Mirror 5 (SiO$_2$) | 600 nm | 2450 nm |  |
| Mirror 4 (W) | 550 nm | — |  |
| Mirror 3 (SiO$_2$) | 600 nm | — |  |
| Mirror 2 (W) | 600 nm | — |  |
| Mirror 1 (SiO$_2$) | 100 nm | — |  |
| Substrate (Si) |  | 725 nm |  |

Figure 7:
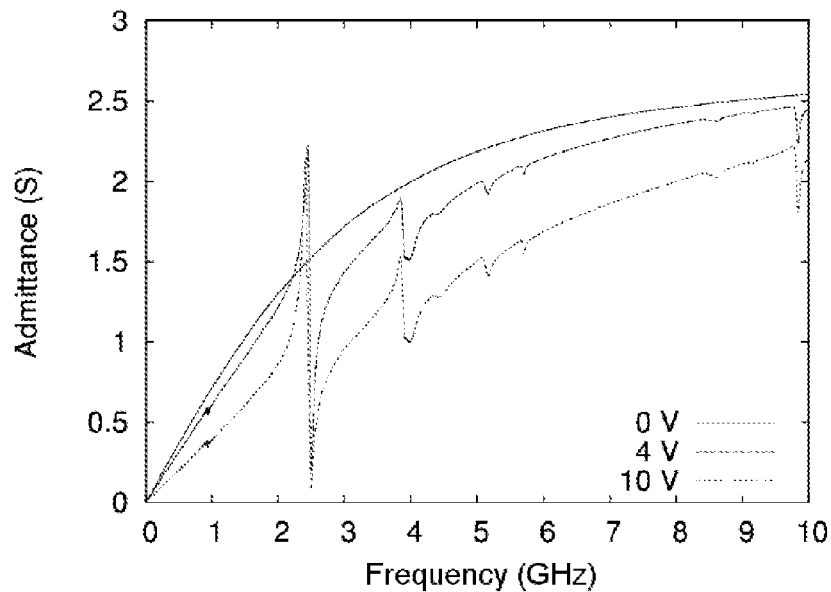
FIG. 7 illustrates the evolution of the electrical response of a BST resonator as a function of the applied static voltage.
Figure 11:
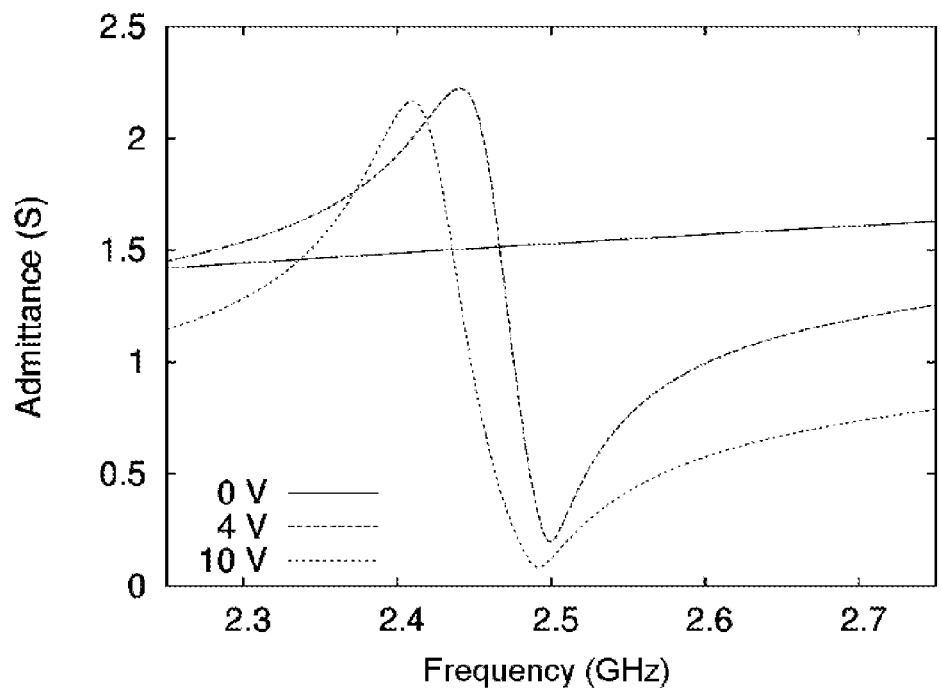
FIG. 11 illustrates the electrical response of a ferroelectric resonator as a function of the applied bias voltage.

This stack makes it possible to obtain a resonator operating for example in the ISM band, and exhibiting sufficient frequency agility to allow it to cover the channels of the band that are situated between 2.412 and 2.472 GHz. Its electrical response is represented in FIGS. 7 and 11, for various values of static bias voltage.

It is possible to note a variation in the resonant frequency over the span envisaged for various voltage values, as well as a variation in static capacitance of almost a factor of 2. The use of an external capacitor, which is difficult to match exactly, could not follow such variations as a function of applied voltage.

In accordance with the present invention, a capacitor has been produced on the basis of the same ferroelectric film of BST and metallizations to define the electrodes. With a view to not undergoing the spurious resonances of the capacitor at the working frequencies, the passivation layer has been removed at the level of the capacitor.

To attenuate the remaining resonances, the Bragg mirror structure is not retained under the capacitors: this is obtained by not retaining the layers of W at this location.

Figure 12:
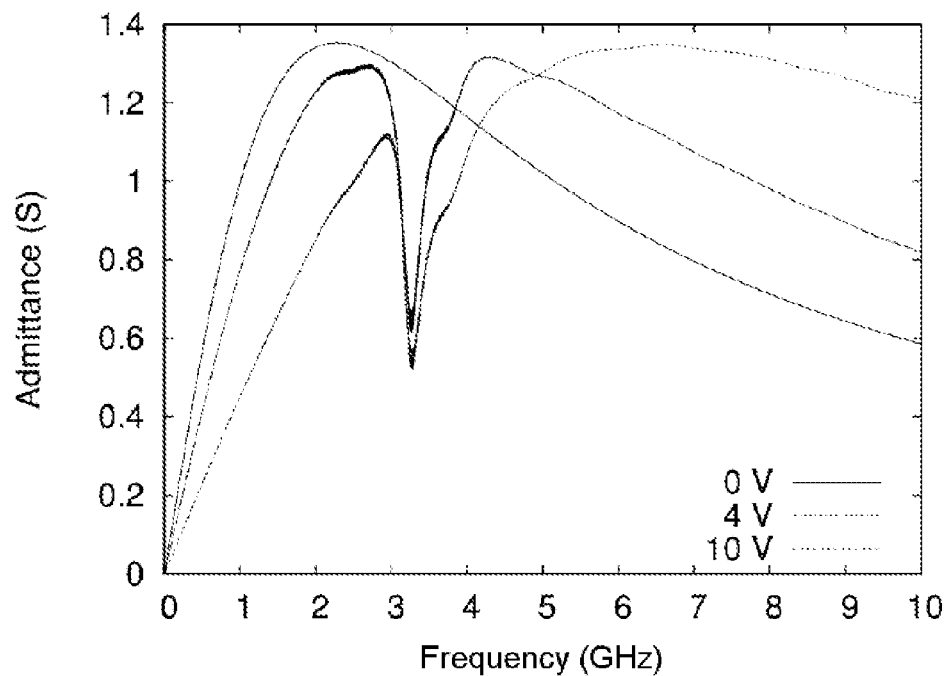
FIG. 12 illustrates the electrical response of the capacitor obtained by removing the Bragg mirror and the passivation layer.
Figure 13:
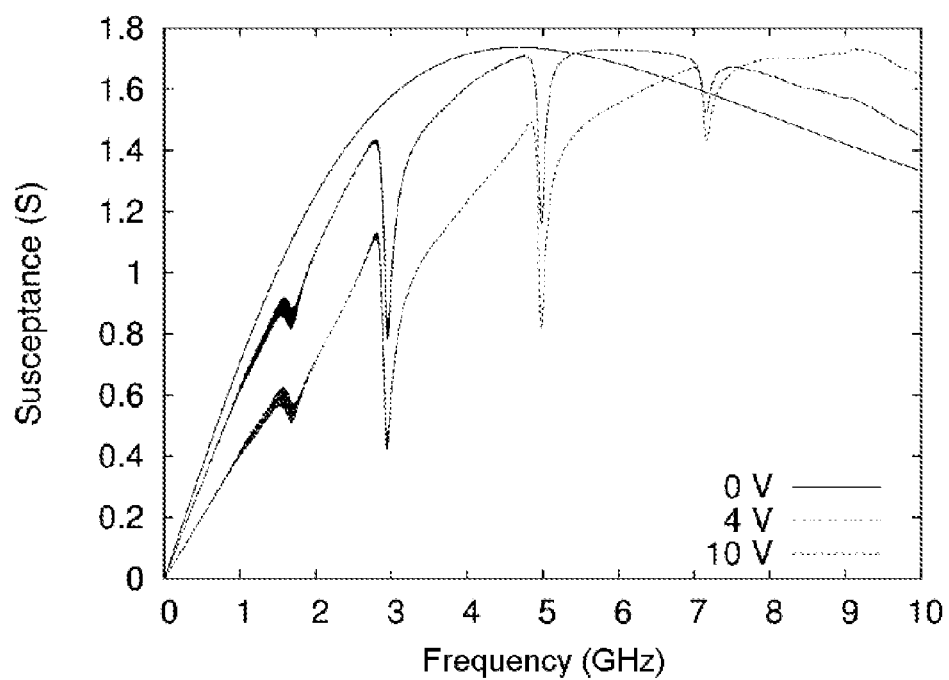
FIG. 13 illustrates the electrical response obtained by removing the Bragg mirror and by placing metallic reinforcements directly on the capacitor.

The stack of thus formed capacitors is presented in the third column of Table 1, and the electrical response of the capacitors is provided in FIG. 12. The susceptance curve (imaginary part of the admittance) exhibits the variation by a factor of almost 2 of the capacitance, in accord with the variations in static capacitance of the resonator corresponding to the configuration of column 2 of Table 1, for the same voltage values.

The acoustic resonance at 2.45 GHz has given way to a multitude of weaker resonances, since in practice they are obtained by resonances of the acoustic waves propagating in the substrate. A more marked resonance appears in the vicinity of 3 GHz, beyond the working frequency, corresponding to the resonance of the waves confined in the BST resonator. By reducing the thicknesses of the electrodes (and by thickening in return the passivation thickness so as to regain the target resonant frequencies) it is possible to increase the frequency of this spurious resonance to some extent if necessary.

The previous example has presented a procedure for fabricating a capacitor by increasing the resonant frequency of the waves generated by the ferroelectric film in the capacitors. It is conversely possible to lower this frequency. This can for example be obtained by adding a mass-related load to the stack. In order not to introduce an additional layer as is conventionally done for bulk wave resonators as described in the article by A. A. Shirakawa, J. M. Pham, P. Jarry, E. Kervhervé, Design of FBAR filters at high frequency bands, International Journal of RF and Microwave Computer-Aided Engineering, vol. 17, p. 115 (2007), the added metallic reinforcements are here used to optimize the electrical contacts, that is to say a significant thickness of metal (1 µm).

Figure 14A:
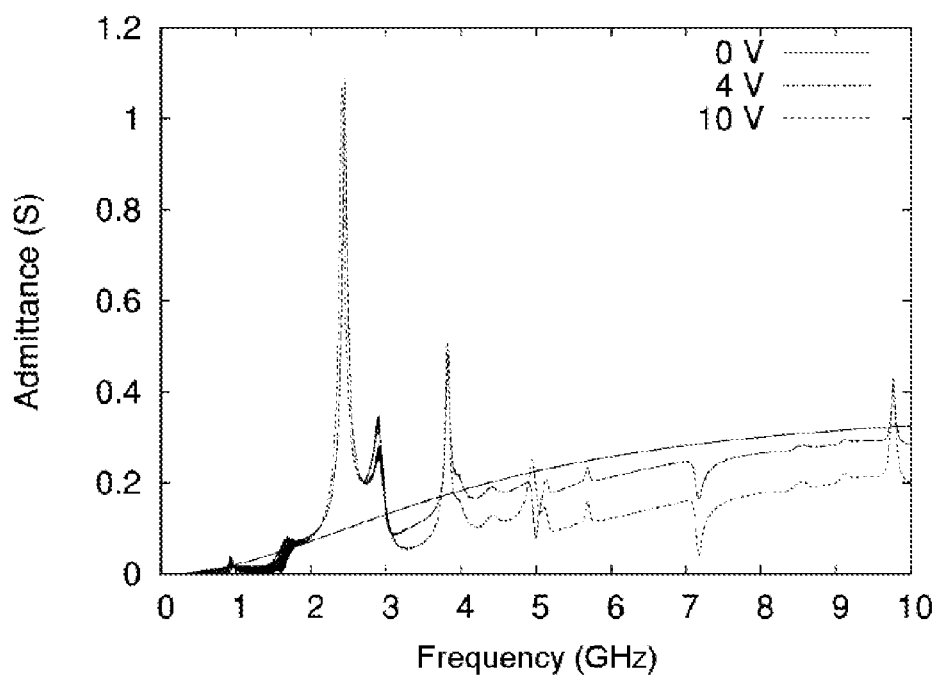
FIGS. 14a and 14b illustrate the electrical response of the circuit for compensating the static capacitance of the resonator using a second exemplary capacitor.
Figure 14B:
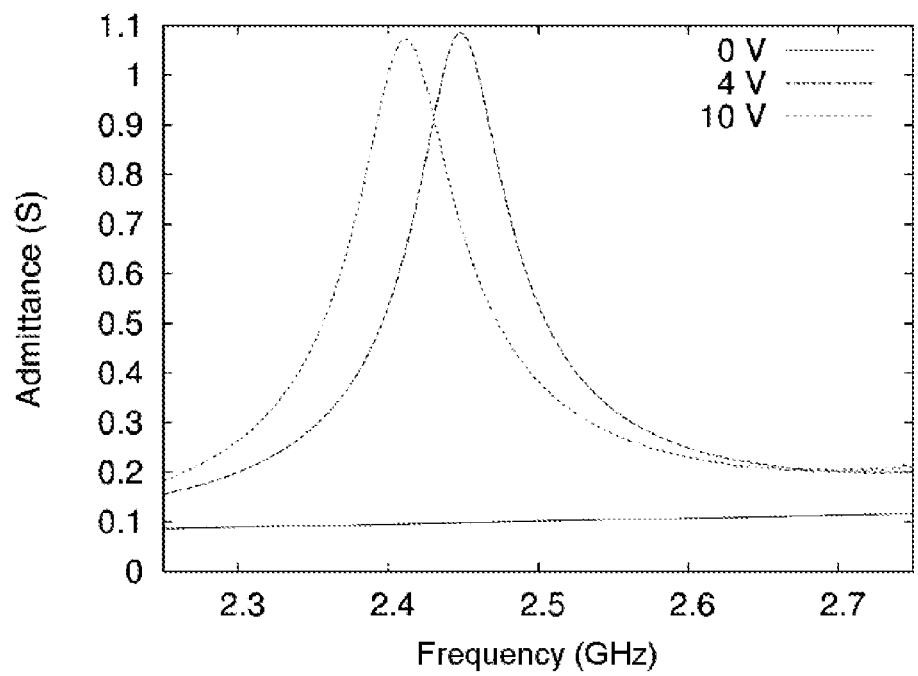

FIGS. 14a and 14b illustrate the electrical response of the circuit for compensating the static capacitance of the resonator using this second version of capacitors. As shown by these figures, the resonance of the BST layer (accompanied by resonances caused by the reflections of the waves on the rear face of the silicon) is shifted to a frequency of 1.7 GHz, while additional spurious resonances in the metallic layer make their appearance at 3, 5 and 7 GHz. It is noted that the value of the capacitance is not always impacted however.

The spurious resonances of the capacitors cause admittance spikes to appear at 1.5, 3 and 4 GHz, but without them being critical for the operation of the filter. The narrow-band response, as illustrated in FIG. 14b, shows moreover that the resonance of the filter is particularly smooth, since the capacitors no longer exhibit resonances related to the reflections on the rear face of the substrate at the working frequencies.

First Exemplary Application

Use of the Invention in a Circuit for Compensating the Static Capacitance of a Ferroelectric Resonator This first exemplary embodiment relates to the first exemplary filter described previously: a frequency-tunable resonator is produced on the basis of a film of BST deposited on a Bragg mirror. The compensation capacitors are for their part produced by locally removing the passivation layer.

Figure 15A:
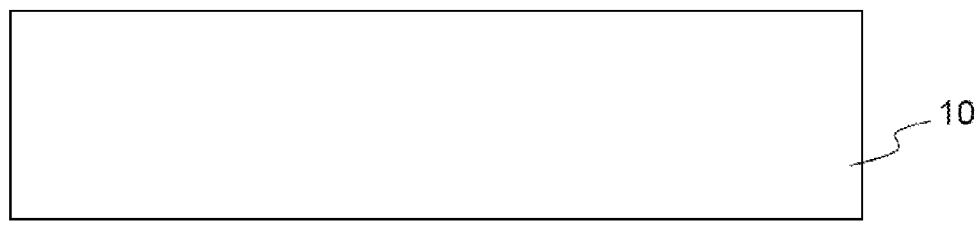

According to a first step illustrated in FIG. 15a, the cleaning of a high resistivity silicon substrate 10 is undertaken.

Figure 15B:
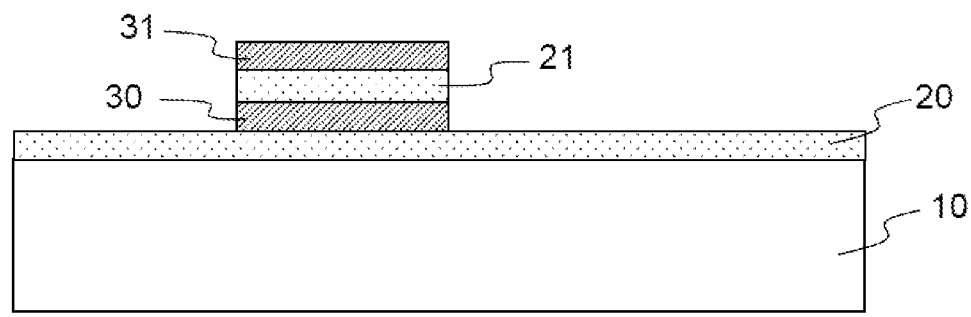

According to a second step illustrated in FIG. 15b, the production of the following stack is undertaken so as to produce a Bragg Mirror structure, on the substrate 10:
- a 100 nm layer 20 of $SiO_2$ by PECVD deposition
- an assembly 30 comprising:
  - a 10 nm layer of TiN
  - a 600 nm layer of W:
- a layer 21 of $SiO_2$ nm by PECVD deposition
- an assembly 31 comprising:
  - a 10 nm layer of TiN;
  - a 600 nm layer of W Next a method of lithography, dry etching, of the layers W/$SiO_2$/W and resin removal is used so as to define metallic patterns defining the layers of the Bragg mirrors under the resonators.

Figure 15C:
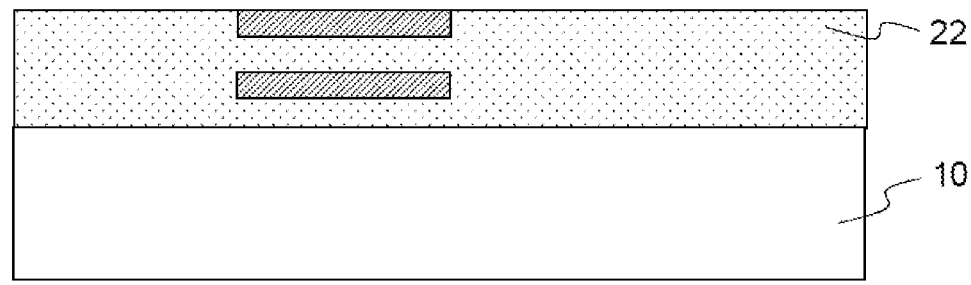

According to a third step illustrated in FIG. 15c, the deposition of a 2300 nm layer 22 of $SiO_2$ is carried out. Next, use is made of a method of photolithography, partial etching (1800 nm) of a counter-mask, resin removal and finally planarization of the $SiO_2$ so as to be flush with the level of the tungsten patterns.

Figure 15D:
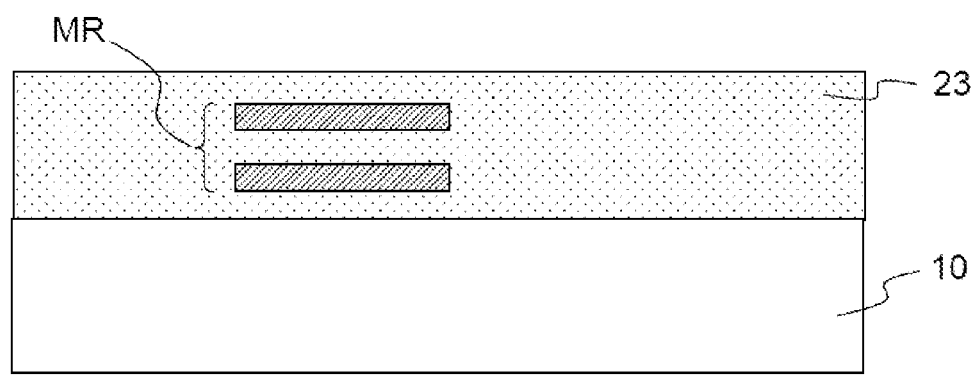

According to a fourth step illustrated in FIG. 15d, the deposition of a 640 nm thick layer 23 of $SiO_2$ corresponding to the upper Bragg mirror layer MR is undertaken.

Figure 15E:
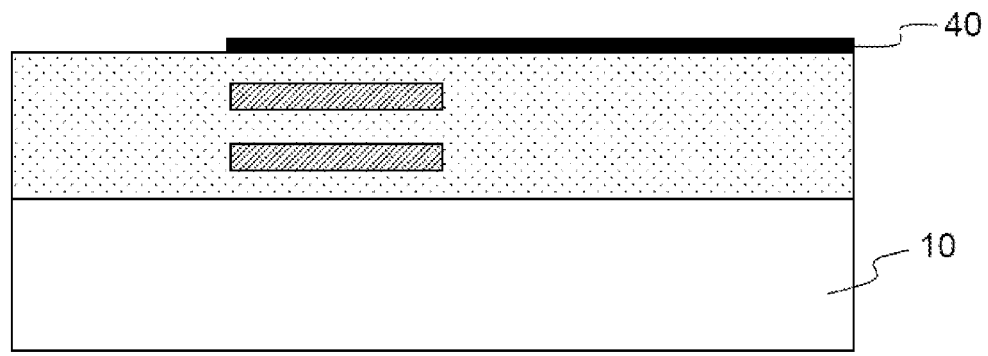

According to a fifth step illustrated in FIG. 15e, the deposition of a binding growth layer of Ti (40 nm) is undertaken by sputtering, oxidation, followed by deposition of a layer of Pt (200 nm) by sputtering. By photolithography, creep of the resin in a stove, IBE etching (Ion Beam Etching), and then resin removal, a lower metallization 40 is thus defined.

Figure 15F:
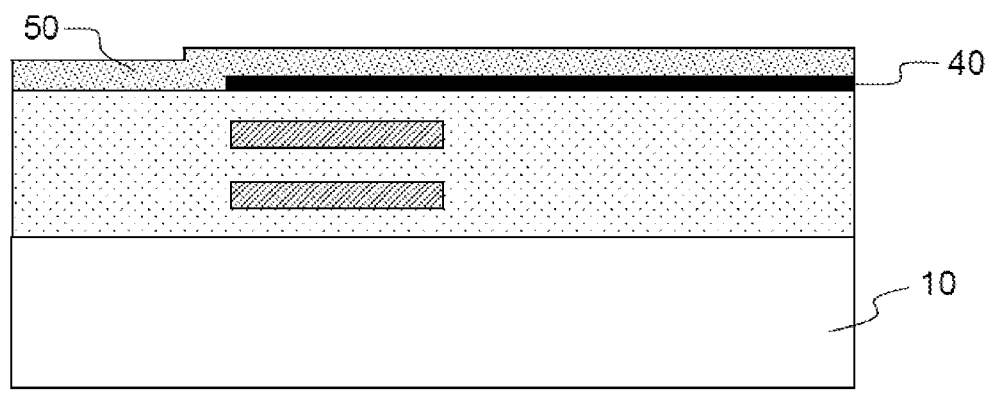

According to a sixth step illustrated in FIG. 15f, the production is undertaken of a layer 50 of BST by sol-gel and stringing together of 8 steps of spreading/drying on heating plate/calcination to achieve a BST layer thickness of 240 nm in thickness.

Figure 15G:
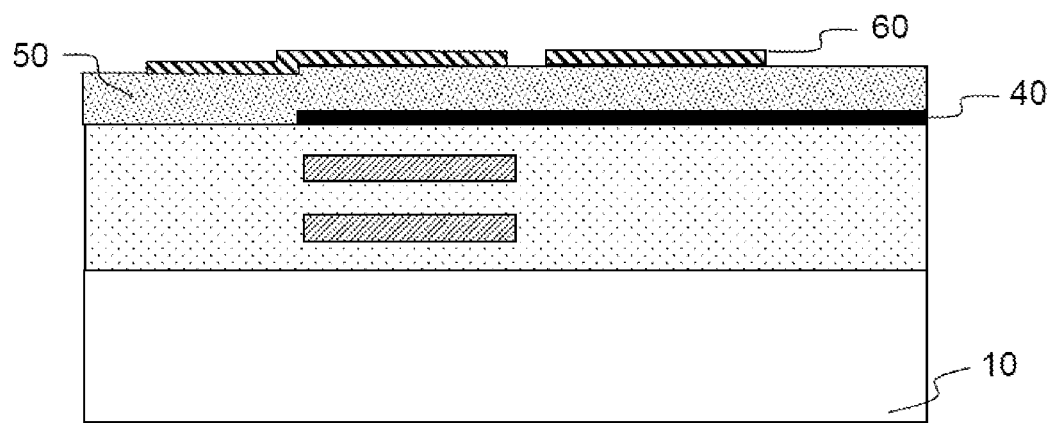

According to a seventh step illustrated in FIG. 15g, the deposition of a layer 60 of Ru (220 nm) by sputtering is undertaken. By photolithography, wet etching of the Ru, resin removal, upper metallizations are obtained.

Figure 15H:
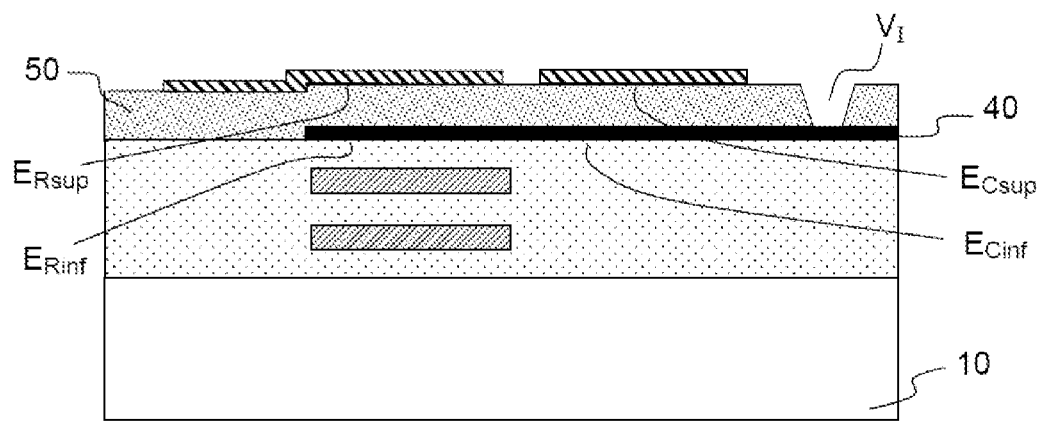

According to an eighth step illustrated in FIG. 15h, an opening of contacts $V_I$ to the lower electrode is produced by photolithography, wet etching of the BST (HF/HCl), resin removal is also undertaken. In this figure, the electrodes $E_{Rsup}$ and $E_{Rinf}$ of the resonator have been referenced, as have those of the compensation capacitor: $E_{Ccsup}$ and $E_{Ccinf}$.

Figure 15I:
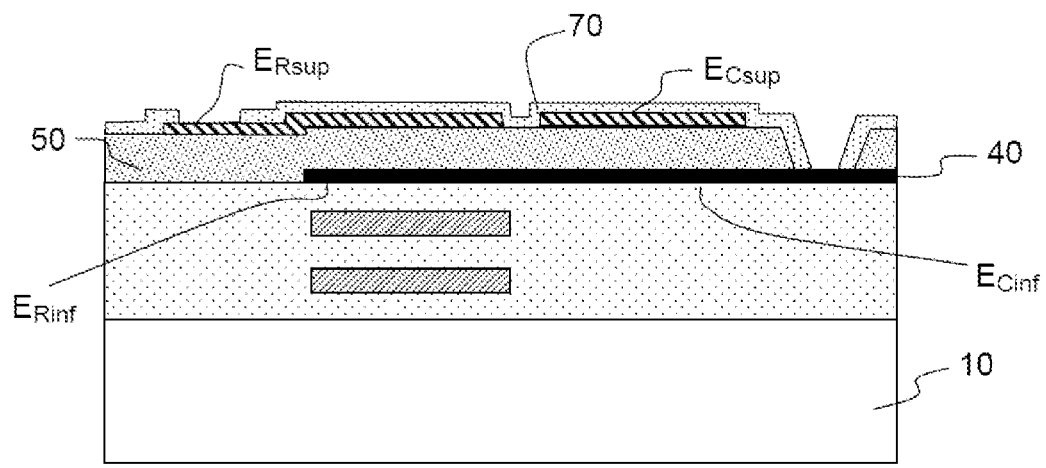

According to a ninth step illustrated in FIG. 15i, a deposition of a passivation layer 70 that may be of $SiO_2$ is produced by PECVD. Also undertaken by photolithography and wet etching (HF) is the production of opening of this passivation layer at the level of the vias so as to open contacts to the lower and upper electrodes, resin removal is then undertaken.

Figure 15J:
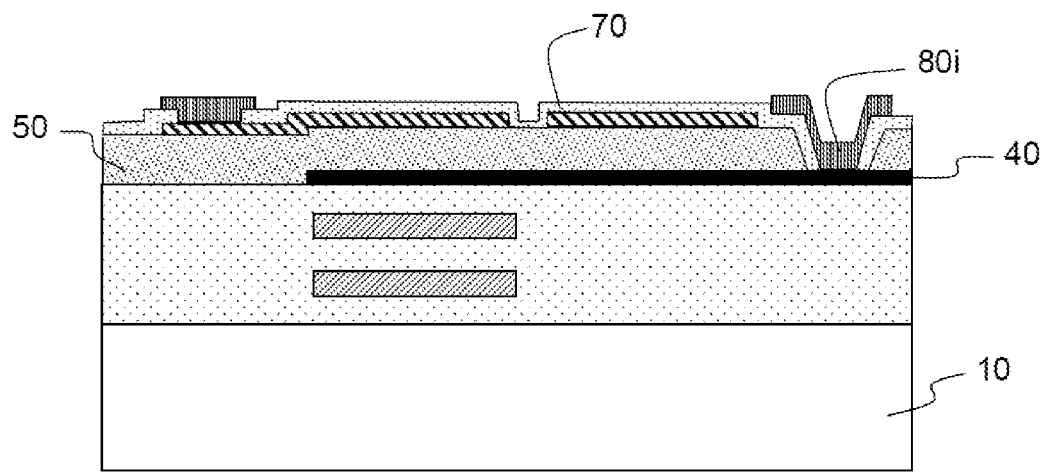

According to a tenth step illustrated in FIG. 15j, the deposition of two layers of Cr/Au by sputtering is undertaken. Electrical contacts 80i are defined by photolithography, wet etching, and then resin removal.

Figure 15K:
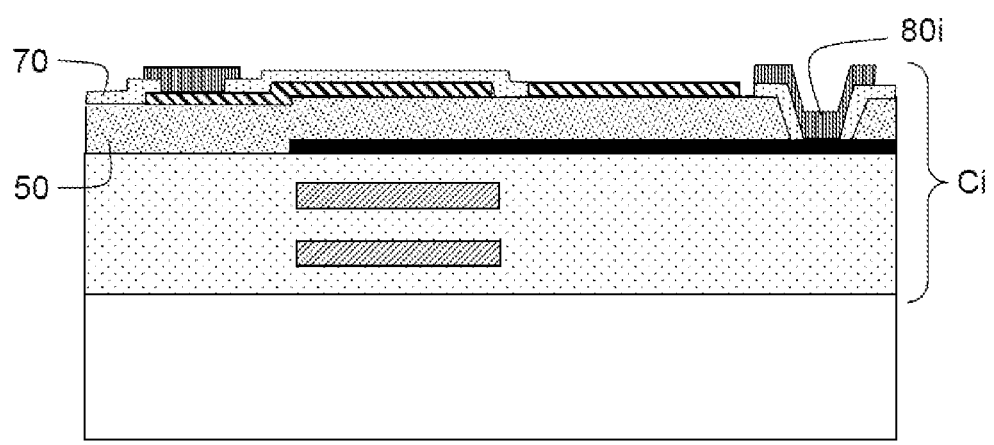
Figure 15I:
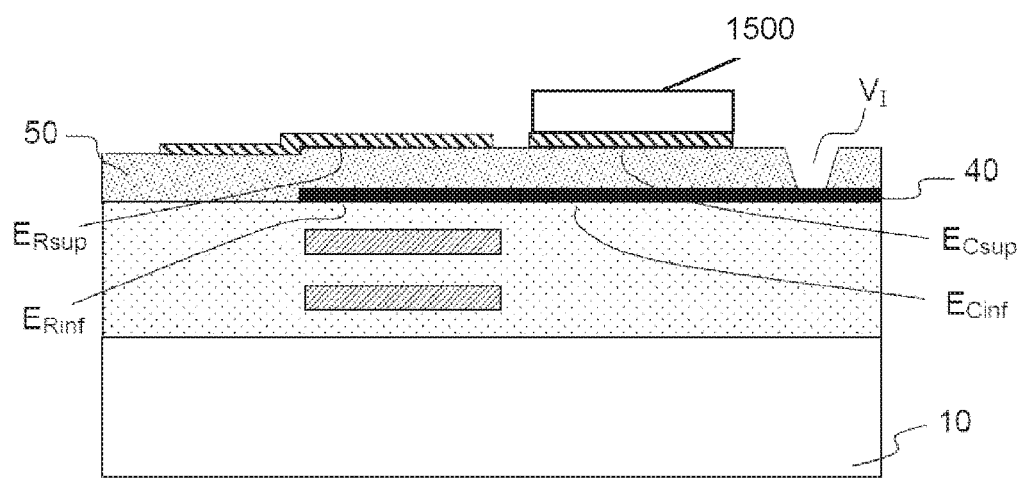

According to an eleventh step illustrated in FIG. 15k, some passivation oxide is cleared by photolithography, dry etching at the level of the layer 70, and then by resin removal openings are cleared at the level of the capacitors in this layer 70.

FIG. 15k thus highlights an exemplary acoustic structure of the present invention:

a stack of layers Ci above a silicon substrate comprising the set of the following layers:
- a thick layer of $SiO_2$ comprising locally a Bragg mirror structure;
- a lower metallization layer making it possible to define the lower electrodes of the resonator and of the co-integrated capacitor;
- a layer of BST ferroelectric material corresponding to the active layer;
- an upper metallization layer in which the upper electrodes of the resonator and of the co-integrated capacitor are defined;
- an upper passivation layer locally removed at the level of the capacitor so as to modify the acoustic resonances without modifying the value of the co-integrated capacitor when the resonator is made to vary in frequency.

Figure 1:
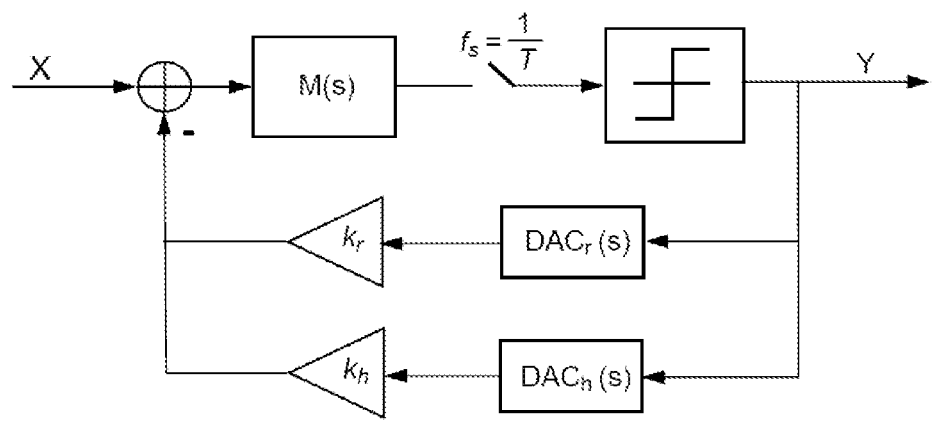
FIG. 1 illustrates the diagram of a reception system using a bandpass analogue-digital converter, and including a resonator in the circuit.
Figure 2:
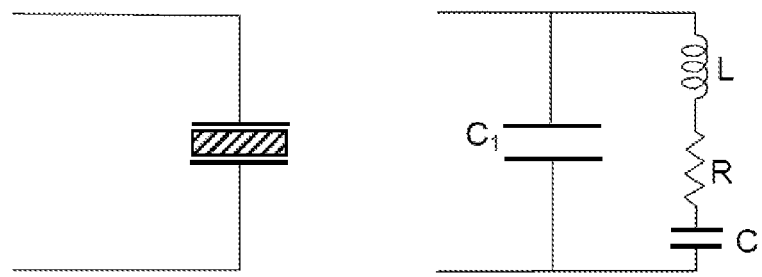
FIG. 2 illustrates the diagram equivalent to a Butterworth-Van Dyke electromechanical or acoustic resonator.
Figure 3:
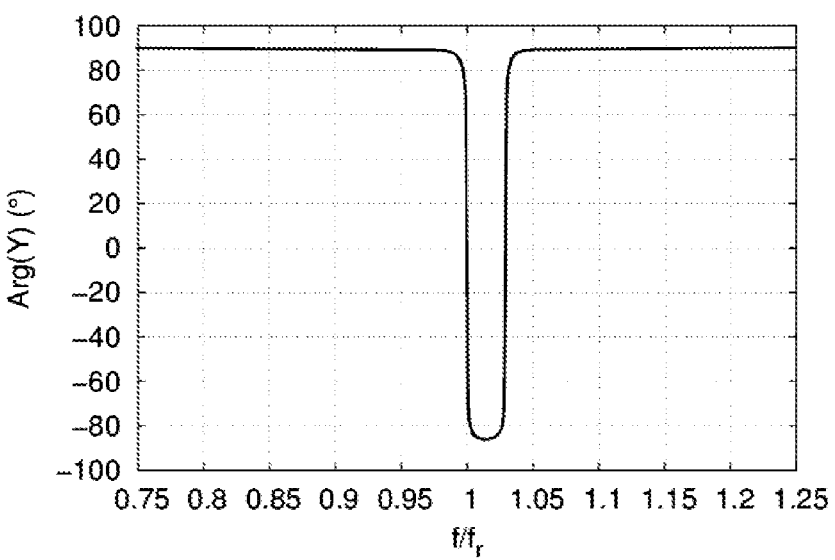
FIG. 3 illustrates the phase of the admittance of an electromechanical or acoustic resonator.
Figure 4:
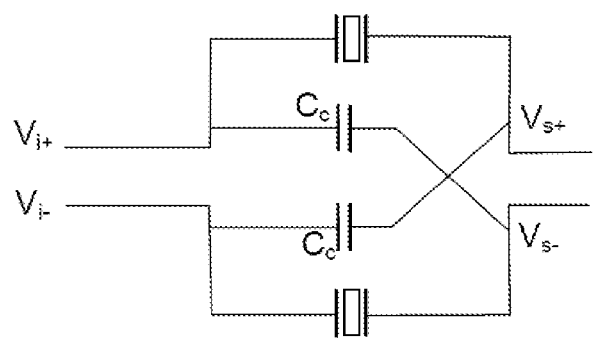
FIG. 4 illustrates the diagram of a filter obtained by compensation of the static capacitance of an acoustic resonator.
Figure 5:
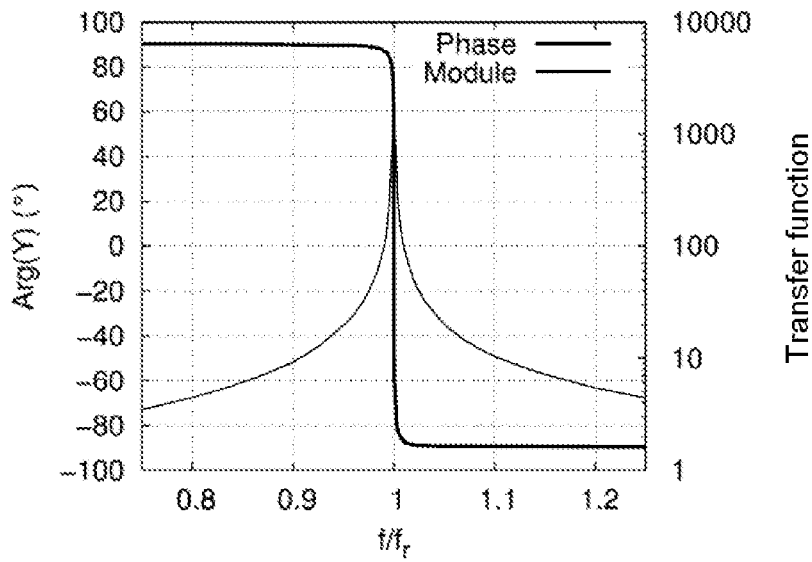
FIG. 5 illustrates the transfer function of an acoustic resonator whose static capacitance has been compensated.
Figure 6:
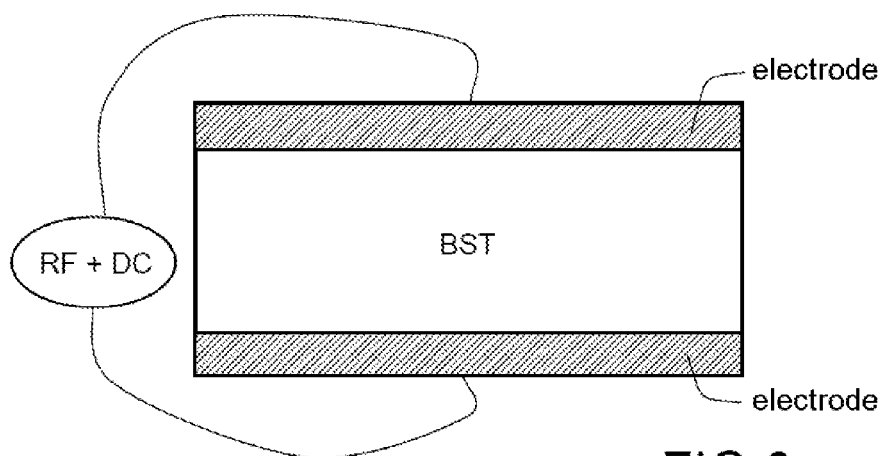
FIG. 6 illustrates the principle of a frequency-agile resonator using a film of BST.
Figure 16A:
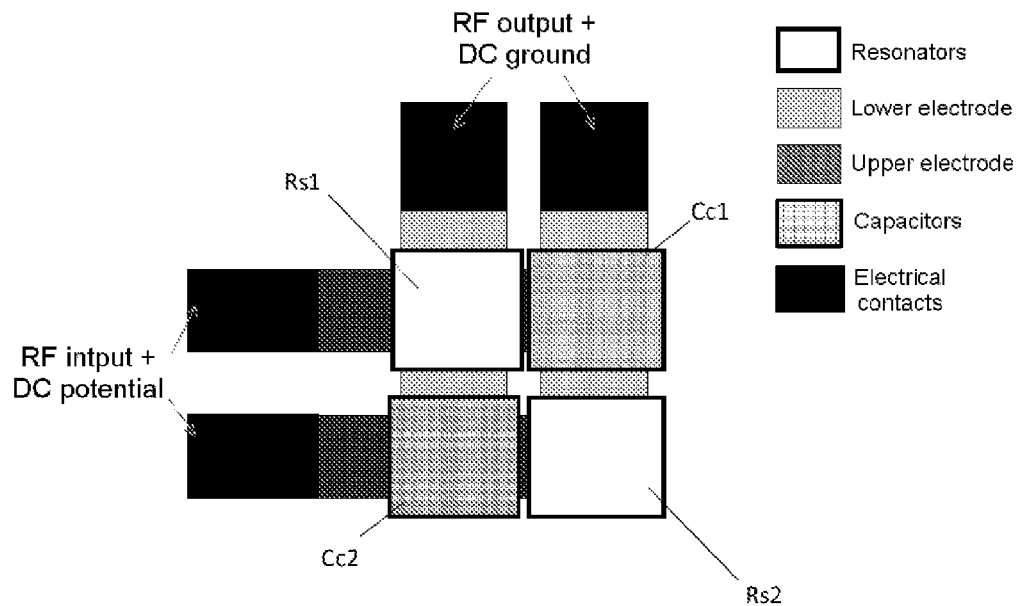
FIGS. 16a and 16b illustrate possible examples of connection of the first exemplary structure represented in FIG. 15k.
Figure 16B:
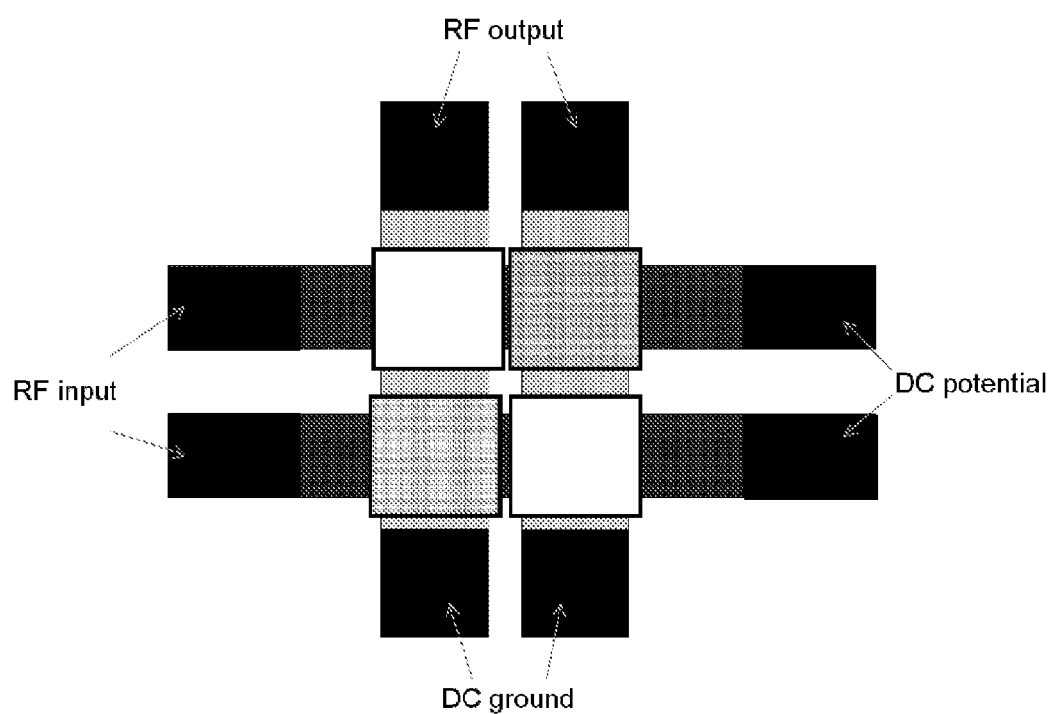

FIGS. 16a and 16b illustrate examples of drawings of masks making it possible to produce resonators whose static capacitance is compensated in a bridge arrangement such as that represented in FIG. 4, and comprising two resonators $Rs_1$ and $Rs_2$ thus coupled electrically to the two compensation capacitors $C_{c1}$ and $C_{c2}$.

Because of the lattice-like topology of the structure, the electrical inputs are all situated on one and the same metallization level, here the upper electrodes, while the electrical outputs are located on another level. The ground is not represented, the latter being virtual for a differential circuit. In this circuit, the resonators and the capacitors are biased with the same potentials if a static potential difference is applied between the input and output electrodes (same potential for the two input electrodes and same potential for the two output electrodes). This potential difference can be superimposed directly on the RF signals. FIG. 16a shows a configuration in which the RF connections and the static controls of the capacitors are not distinct. FIG. 16b shows a configuration in which the RF connections and the static controls of the capacitors are distinct.

A variant of the first exemplary acoustic structure of the invention can be obtained by substituting the operation of local removal of the passivation layer with the production of over-thicknesses of the metallization layer 60 (illustrated notably in FIG. 15h) at the level of the compensation capacitor. In one example, the second subset of layers (including at least the layers 60, 50 and 40), at least one layer 1500 is able to absorb the acoustic waves as illustrated in FIG. 15l.

Second Exemplary Application

Figure 8:
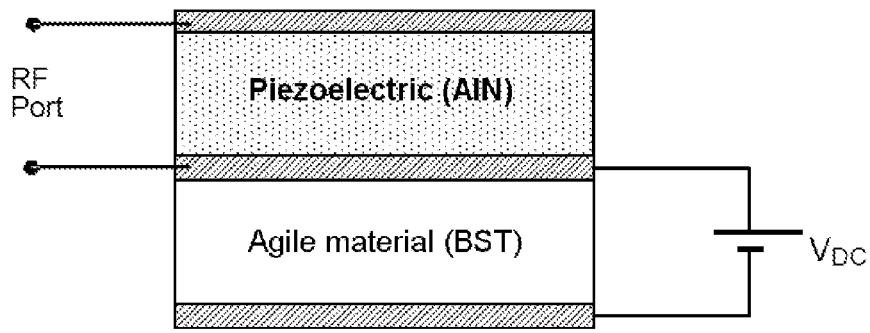
FIG. 8 illustrates an AlN/BST composite resonator driven by a DC voltage.
Figure 9:
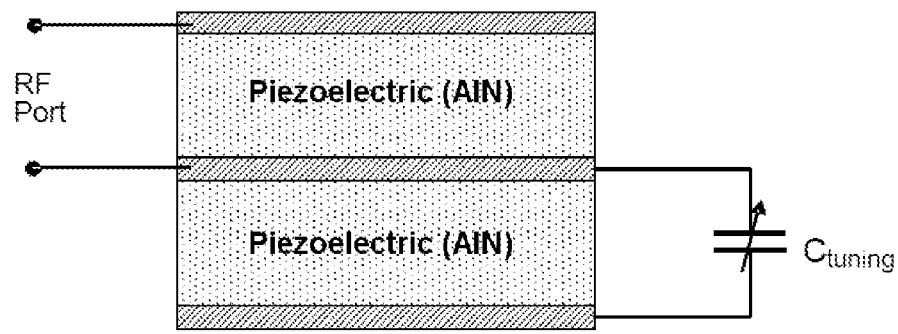
FIG. 9 illustrates an AlN/AlN composite resonator driven by a variable capacitor.
Figure 10:
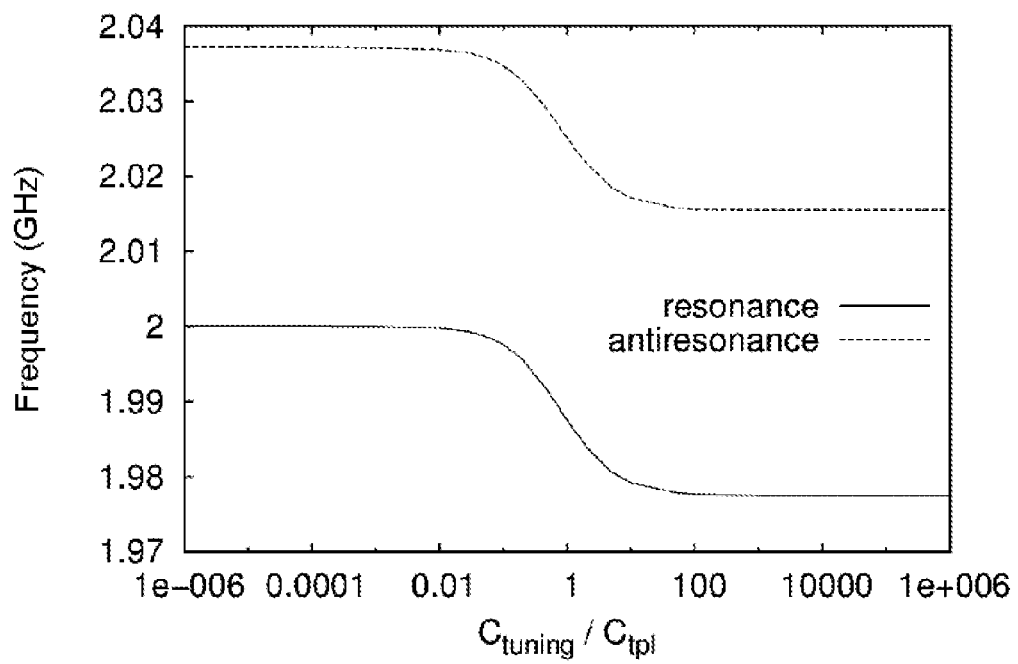
FIG. 10 illustrates the frequency variations of a composite resonator as a function of the adjusting capacitance value.

Use of the Invention in a Circuit for Compensating the Static Capacitance of a Piezoelectric/Ferroelectric Composite Resonator According to the present invention, it is also possible to use so-called "composite" resonators, such as those of FIG. 8. In this case, it is sought to compensate the static capacitance exhibited by the AlN piezoelectric layer linked to the RF circuit, the BST layer serving only to ensure frequency variation. In this configuration, the embodiment of the invention can be embodied in several ways, as a function of the design of the resonator, and in particular of the thicknesses of the tunability layer:
- if the tunability layer possesses a thickness close to a quarter-wave, it exhibits only little influence on the frequency of the complete resonator. In this case, the surest means of shifting the resonant frequencies consists in adding a metal surface, or in performing a passivation opening as in the two previous exemplary embodiments;

if on the other hand the tunability layer differs appreciably from a quarter-wave, its local removal gives rise to a large frequency variation which can advantageously be used with a view to the present invention.

Together, the method steps described in FIGS. 17a to 17f illustrate a method of manufacture allowing such an acoustic structure.

Figure 17A:
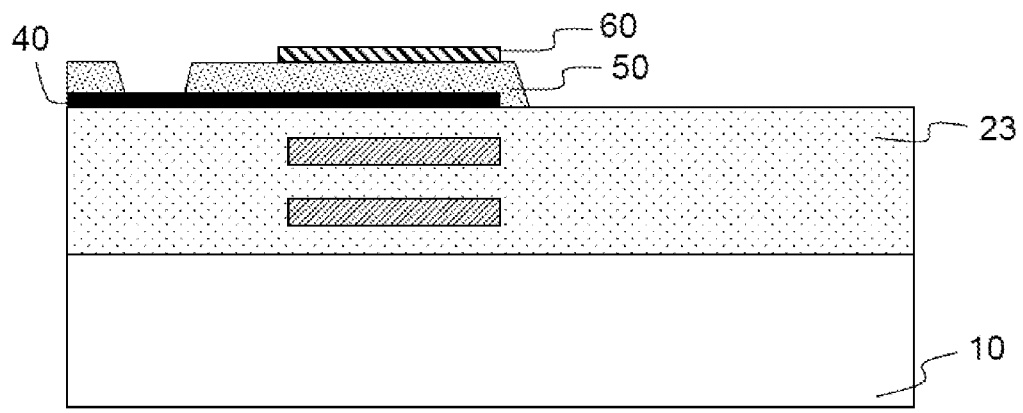
FIGS. 17a to 17f illustrate the various steps for producing a second exemplary acoustic structure of the invention.

The method steps are common to those of the first exemplary use of acoustic structure of the invention, as far as the step of defining the upper electrodes. The stack of layers 23, 40, 50 and 60 has therefore been constructed on the silicon surface 10. The only difference is that at the design level, provision is made for wide openings of the BST layer 50 so as to clear some surface area for the production of the capacitors, as represented in FIG. 17a.

Figure 17B:
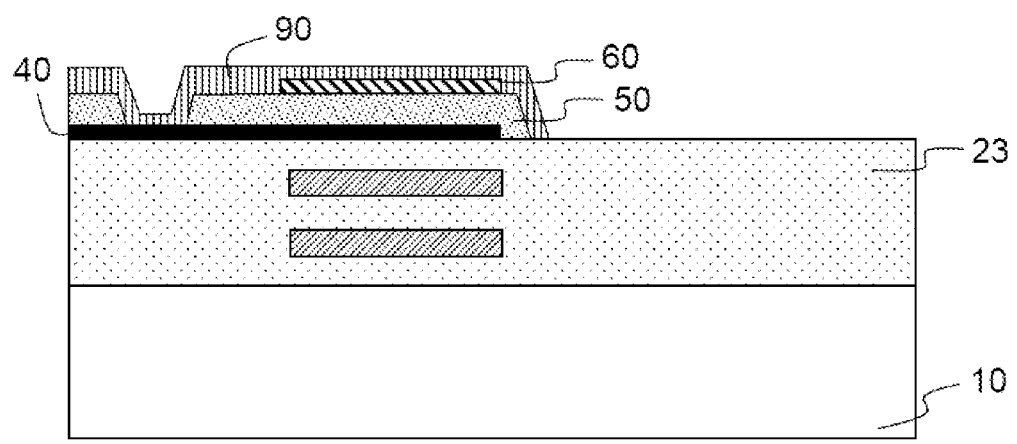

According to a subsequent step, illustrated in FIG. 17b, the deposition of an $SiO_2$ electrical insulation layer 90 by PECVD is undertaken, so as to encapsulate the stack of the BST ferroelectric material inserted between a lower electrode and an upper electrode.

Figure 17C:
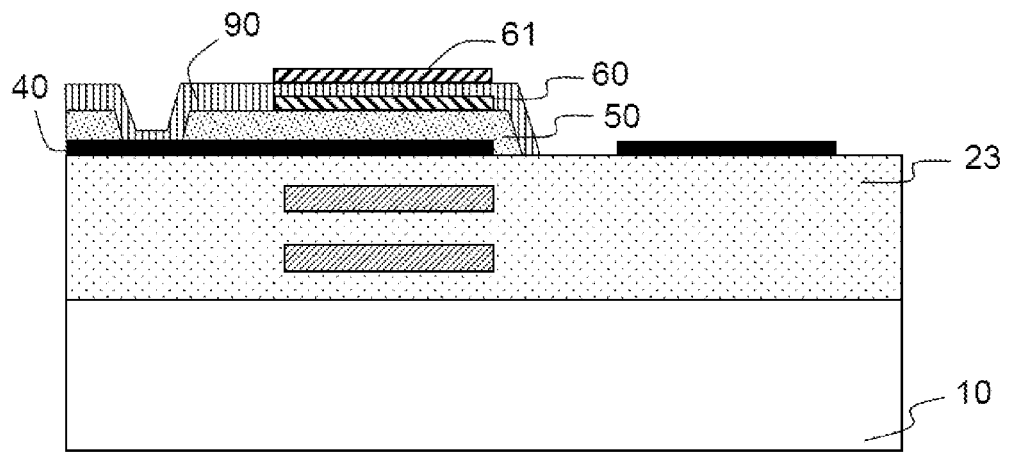

According to a subsequent step, illustrated in FIG. 17c, the deposition is undertaken of a Molybdenum metallization layer 61 which will serve as lower electrode to the piezoelectric layer, localized by fluorinated dry etching in the presence of a resin mask.

Figure 17D:
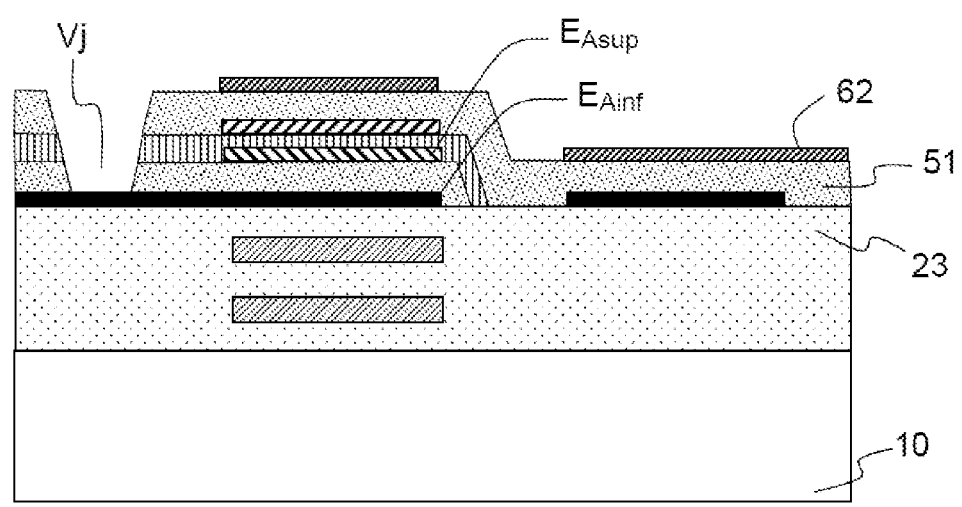

According to subsequent steps, illustrated in FIG. 17d, the deposition is undertaken of the active layer 51 of this acoustic structure with an AlN piezoelectric material by reactive cathodic sputtering. The deposition of an upper layer 62 of Mo by sputtering is carried out thereafter. Upper electrodes are then defined by photolithography and fluorinated dry etching. Thereafter, electrical contact openings Vj are produced through the dielectric layers by photolithography, chemical etching of the AlN in a bath of $H_3PO_4$ heated to 80° C., and then etching of the electrical insulation layer in a bath of hydrofluoric acid. This figure highlights the electrodes of the frequency-tunable part $E_{Asup}$ and $E_{Ainf}$.

Figure 17E:
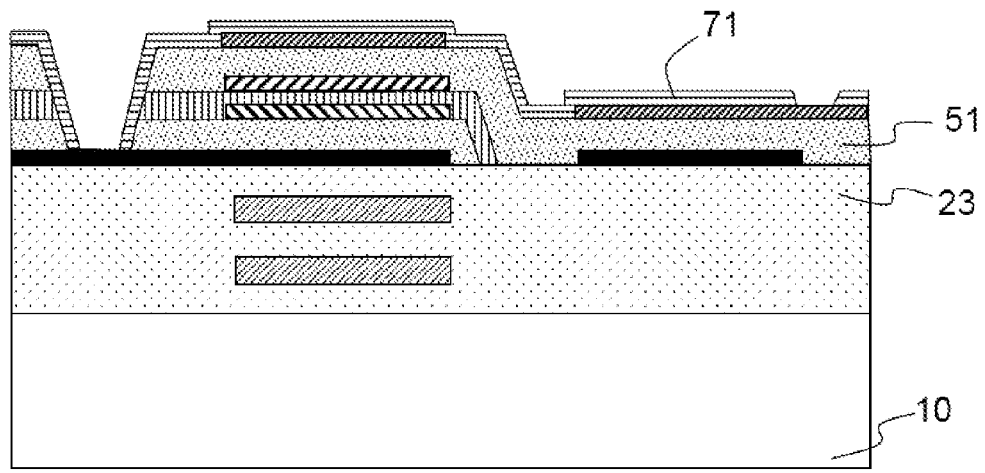

According to subsequent steps illustrated in FIG. 17e, the deposition of an SiN passivation layer 71 by PECVD and the production of openings of this passivation at the level of the electrical contacts by photolithography and dry etching are undertaken.

Figure 17F:
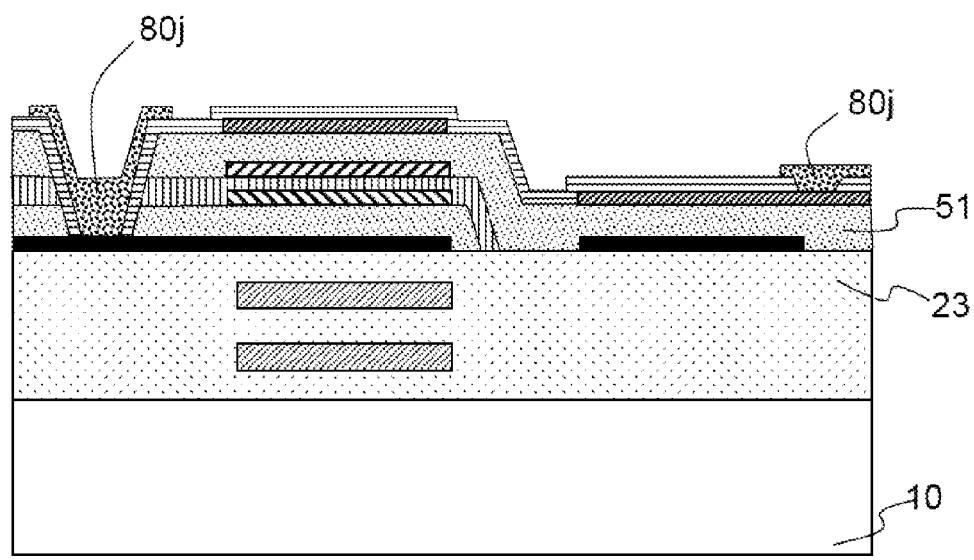

Finally, during a step illustrated in FIG. 17f, the production of electrical contacts 80j of AlCu by sputtering and definition of these contacts by photolithography and then wet etching are undertaken.

Third Exemplary Application

Use of the Invention to Produce the Circuit for Compensating the Static Capacitance of a Lamb Wave Resonator with Extended Cavity In a previous patent application (A. Reinhardt, E. Defaÿ, F. Perruchot, Dispositif électromecanique à ondes acoustiques comprenant une zone de transduction et une cavité étendue [Electromechanical device based on acoustic waves comprising a transduction zone and an extended cavity], patent application FR 1153633, April 2011), the Applicant has proposed using a Lamb wave resonator structure possessing an extended resonance cavity. In this patent application, the authors mentioned that this cavity was able to serve to render this type of resonator frequency-drivable if the cavity was metallized with the aid of interdigital combs linked to an external variable capacitor. This capacitor must exhibit values which are equal or proportional to the capacitance obtained at the terminals of the electrodes disposed on the frequency-tuning cavity. This structure is in practice the analogue to that of the composite resonator of the second example, but in which the propagation of the acoustic waves is no longer vertical, but horizontal in the plane of the piezoelectric layer.

To the extent that the frequency-driving circuit of such a resonator is ideally a bank of switched capacitors (only this type of circuit makes it possible to exhibit very large variations in the capacitance values), it becomes necessary to produce a certain number of individual capacitors whose value is proportional to the capacitance exhibited by the metallizations disposed on the cavity of the resonator. To ensure strict proportionality whatever the manufacturing dispersions or the operating conditions, the application of the present invention consists in using the piezoelectric layer employed in producing the resonator (that is to say its transducer and the cavity) to produce the capacitors which will be inserted into the bank of capacitors. The coefficient of proportionality between these capacitances and the capacitance exhibited by the electrodes of the cavity is then fixed by the variations in geometry of the electrodes: variation of the number of combs employed in forming the capacity, or of the length of the fingers, or indeed of a combination of the two.

Figure 18:
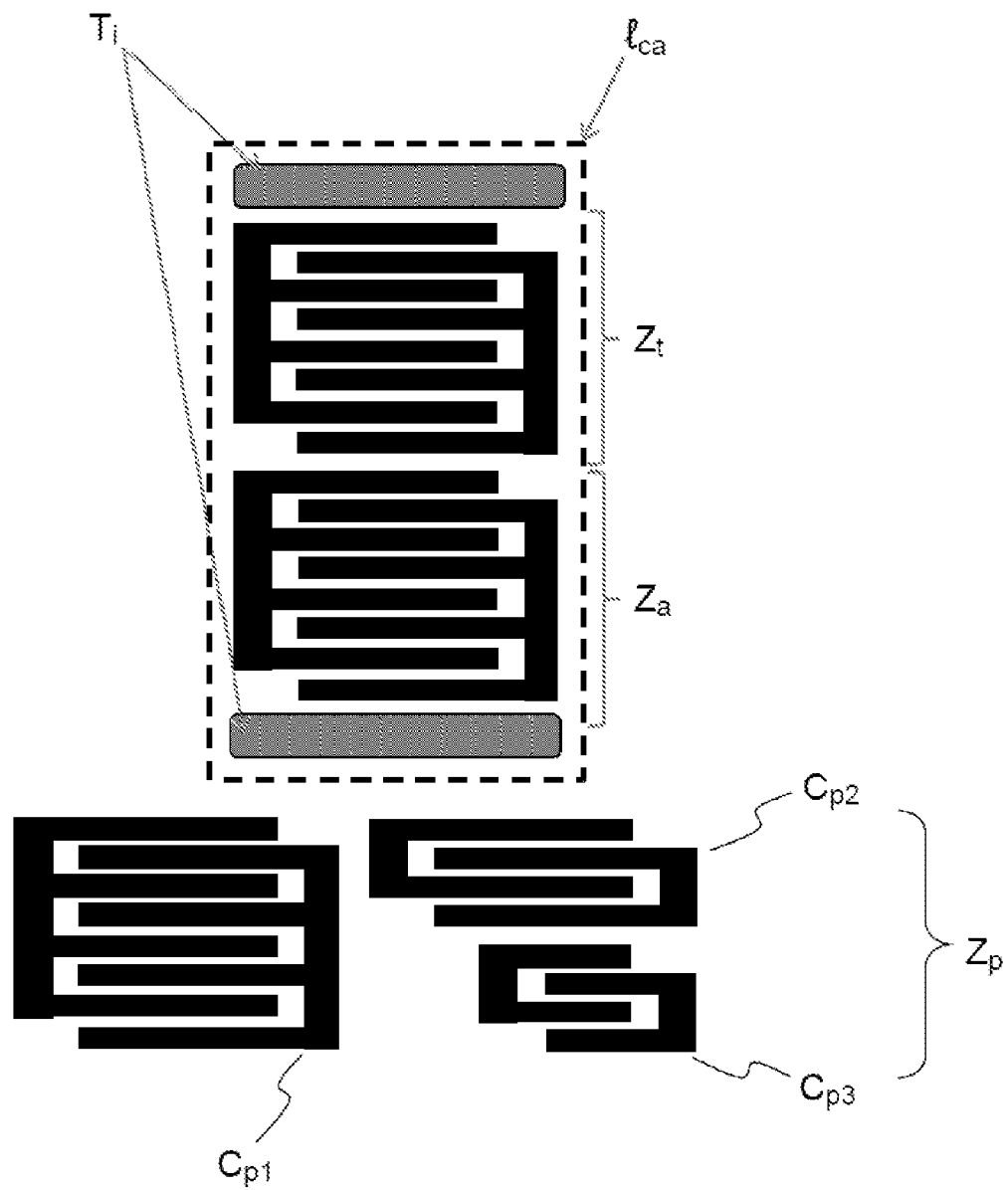
FIG. 18 illustrates a view from above of an acoustic structure according to the invention comprising three cointegrated capacitors within the framework of an exemplary acoustic structure according to the invention comprising a circuit for compensating the static capacitance of a Lamb wave resonator.

FIG. 18 shows a view from above of such a structure with a zone Zt dedicated to transduction, a zone Za dedicated to frequency tuning and a zone Zp dedicated to frequency driving. This zone Zp dedicated to driving comprises in this example, for example three co-integrated tuning capacitors: $Cp_1$, $Cp_2$ and $Cp_3$ able to exhibit capacitance values respectively equal to, half and quarter of the capacitance value of the network of interdigital combs disposed on the cavity.

Figure 19:
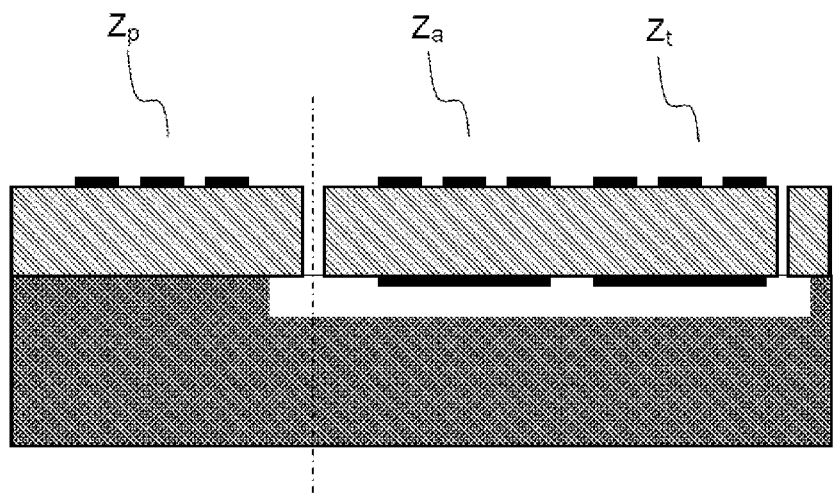
FIG. 19 illustrates a sectional view of exemplary structure illustrated in FIG. 18.

FIG. 19 shows a sectional diagram of this example. The right part corresponds to the resonator and comprises two groups of electrodes in the form of interdigital combs: one serving as transducer (transduction zone Zt) and the other as tuning cavity (tuning zone Za). The whole is acoustically insulated from the substrate by way of an air cavity formed under the resonator. The resonant cavity is defined by vertical trenches disposed on either side of the component and acting as reflectors. One of the capacitors of the driving tuning circuit Zp is represented on the left part of the figure. In order to avoid obtaining spurious acoustic resonances, the capacitors are disposed directly on the substrate. Additional layers can be added to frequency shift any persistent resonances.

Fourth Exemplary Application

Use of the Invention to Compensate the Static Capacitance and Produce the Frequency-Control Circuit for a Piezoelectric/Piezoelectric Composite Resonator A variant of the second example consists in using a piezoelectric layer with a view to obtaining frequency variations, which layer being connected to a bank of capacitors.

Under these conditions, an embodiment can be similar to that detailed in respect of the second example. The step of depositing the lower ferroelectric layer is then replaced with a step of depositing aluminium nitride (for example), by reactive DC-pulsed cathodic sputtering.

Figure 20:
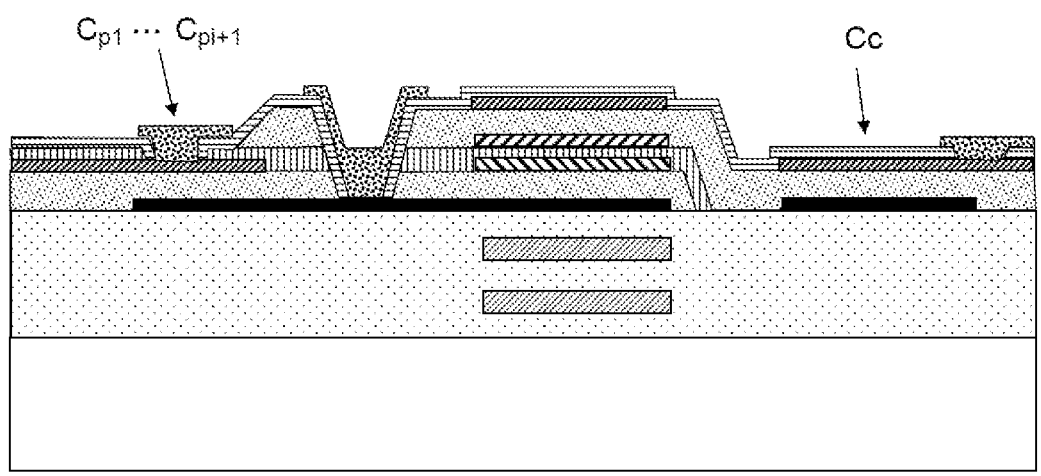
FIG. 20 illustrates a third exemplary acoustic structure of the invention.

The capacitors of the bank of capacitors are then produced in the lower AlN layer, thereby leading to the structure illustrated in FIG. 18. In this configuration, the ratio between the surface area of the resonator and that of the capacitors fixes the position in terms of frequency of the composite resonator, independently of the technological dispersions and temperature variations. FIG. 20 thus highlights a series of capacitors Cp1, Cpi+1 making it possible to adjust the frequency, as well as the compensation capacitor Cc.

The invention claimed is:

1. An acoustic structure comprising at least one acoustic resonator exhibiting a transduction zone and at least one resonant frequency in a band of operating frequencies and an integrated capacitor, said acoustic structure comprising:
    a stack of layers, comprising at least one active layer of a piezoelectric material or of a ferroelectric material;
    the at least one acoustic resonator being frequency tunable and being produced by a first subset of layers of said stack of layers comprising said at least one active layer and at least two electrodes;
    the integrated capacitor being produced by a second subset of layers comprising one of said at least one active layer and said at least two electrodes; and
    the first and second subsets of layers being distinguished by a modification of layers to exhibit different resonant frequencies,
    wherein the second subset of layers is configured to attenuate spurious acoustic resonances by an omission of a reflector under the capacitor or a passivation layer on the capacitor, the second subset of layers including at least one layer configured to absorb acoustic waves.

2. The acoustic structure according to claim 1,
    wherein the at least one acoustic resonator formed by the first subset of layers comprises:
        a first transduction zone exhibiting a first active layer of piezoelectric material or of ferroelectric material and at least two electrodes and
        a second frequency-tuning zone exhibiting a second active layer of ferroelectric material and at least two electrodes; and
    the one active layer of the integrated capacitor formed by the second subset of layers is the first or the second active layer of the at least one acoustic resonator.

3. The acoustic structure according to claim 2, wherein the first active layer is separated from the said second active layer by an electrical insulation layer.

4. The acoustic structure according to claim 3, wherein the electrical insulation layer is made of $SiO_2$.

5. The acoustic structure according to claim 2, further comprising means of frequency-driving of the resonator linked to the at least two electrodes in a tuning zone of the at least one acoustic resonator and to the at least two electrodes of the integrated capacitor.

6. The acoustic structure according to claim 5, wherein a value of the integrated capacitor is equal or proportional to a value of a capacitance exhibited by the tuning zone.

7. The acoustic structure according to claim 2, wherein the at least two electrodes of the transduction zone of the at least one acoustic resonator and the at least two electrodes of the capacitor are produced in the same layer or layers of the stack and exhibit the same geometry.

8. The acoustic structure according to claim 1, wherein the acoustic structure comprises:
    the stack of layers, comprising at least one active layer of ferroelectric material;
    the at least one acoustic resonator comprising at least the said active layer of ferroelectric material to ensure frequency tuning; and
    the integrated capacitor being produced by the second subset of layers comprising at least the said active layer of ferroelectric material and the at least two electrodes.

9. The acoustic structure according to claim 1, wherein the acoustic structure comprises:
    the stack of layers, comprising at least one first active layer of ferroelectric material and a second active layer of piezoelectric material;
    the first subset of layers of the said stack forming the resonator comprising at least the first active layer of ferroelectric material to ensure frequency tuning;
    the integrated capacitor being produced by a second subset of layers comprising at least the said second active layer of piezoelectric material and at least two electrodes.

10. The acoustic structure according to claim 1, wherein the at least two electrodes of the at least one acoustic resonator and/or the at least two electrodes of the integrated capacitor are in one and the same plane or in parallel planes.

11. The acoustic structure according to claim 1, wherein the stack of layers is situated on a surface of a substrate.

12. The acoustic structure according to claim 1, wherein the first subset of layers comprises means for confining the acoustic waves in the resonator.

13. The acoustic structure according to claim 12, wherein the acoustic waves are confined in the at least one acoustic resonator by a Bragg mirror structure, the second subset of layers does not comprise the Bragg mirror structure.

14. The acoustic structure according to claim 12, wherein the first subset of layers comprises a membrane structure situated under the at least one active layer of the at least one acoustic resonator to form a resonator cavity.

15. The acoustic structure according to claim 1, wherein the ferroelectric material is Barium Strontium Titanate (BST).

16. The acoustic structure according to claim 1, wherein the piezoelectric material is AN.

17. The acoustic structure according to claim 1, wherein the structure comprises an upper passivation layer made of $SiO_2$.

18. The acoustic structure according to claim 17, wherein the modification of the stack in the second subset is produced in the upper passivation layer.

19. The acoustic structure according to claim 1, wherein upper electrodes of the at least one active layer in the first subset and in the second subset are produced in one and the same metallic subset of layers, and the modification of the stack in the said second subset is produced by an over-metallization of the said metallic subset of layers.

20. The acoustic structure according to claim 1, further comprising a bridge structure comprising two of the at least one acoustic resonator coupled electrically to two of the integrated capacitors.

21. An acoustic structure comprising at least one acoustic resonator exhibiting a transduction zone and at least one resonant frequency in a band of operating frequencies and an integrated capacitor, said acoustic structure comprising:
    a stack of layers, comprising at least one active layer of a piezoelectric material or of a ferroelectric material;
    the at least one acoustic resonator being frequency tunable and being produced by a first subset of layers of said stack of layers comprising said at least one active layer and at least two electrodes;

the integrated capacitor being produced by a second subset of layers comprising one of said at least one active layer and said at least two electrodes; and the first and second subsets of layers being distinguished by a modification of layers to exhibit different resonant frequencies, wherein the at least one acoustic resonator formed by the first subset of layers comprises:

a first transduction zone exhibiting a first active layer of piezoelectric material or of ferroelectric material and at least two electrodes and a second frequency-tuning zone exhibiting a second active layer of ferroelectric material and at least two electrodes; and the active layer of the integrated capacitor formed by the second subset of layers is the first or the second active layer of the at least one acoustic resonator, the at least one acoustic resonator further comprising:

means of frequency-driving of the resonator linked to the at least two electrodes in a tuning zone of the at least one acoustic resonator and to the at least two electrodes of the integrated capacitor, wherein a value of the integrated capacitor is equal or proportional to a value of a capacitance exhibited by the tuning zone.

22. An acoustic structure comprising at least one acoustic resonator exhibiting a transduction zone and at least one resonant frequency in a band of operating frequencies and an integrated capacitor, said acoustic structure comprising:

a stack of layers, comprising at least one active layer of a piezoelectric material or of a ferroelectric material;

the at least one acoustic resonator being frequency tunable and being produced by a first subset of layers of said stack of layers comprising said at least one active layer and at least two electrodes;

the integrated capacitor being produced by a second subset of layers comprising one of said at least one active layer and said at least two electrodes; and the first and second subsets of layers being distinguished by a modification of layers to exhibit different resonant frequencies, wherein the at least one acoustic resonator formed by the first subset of layers comprises:

a first transduction zone exhibiting a first active layer of piezoelectric material or of ferroelectric material and at least two electrodes and a second frequency-tuning zone exhibiting a second active layer of ferroelectric material and at least two electrodes; and the one active layer of the integrated capacitor formed by the second subset of layers is the first or the second active layer of the at least one acoustic resonator, wherein the at least two electrodes of the transduction zone of the at least one acoustic resonator and the at least two electrodes of the capacitor are produced in the same layer or layers of the stack and exhibit the same geometry.

23. An acoustic structure comprising at least one acoustic resonator exhibiting a transduction zone and at least one resonant frequency in a band of operating frequencies and an integrated capacitor, said acoustic structure comprising:

a stack of layers, comprising at least one active layer of a piezoelectric material or of a ferroelectric material;

the at least one acoustic resonator being frequency tunable and being produced by a first subset of layers of said stack of layers comprising said at least one active layer and at least two electrodes;

the integrated capacitor being produced by a second subset of layers comprising one of said at least one active layer and said at least two electrodes;

the first and second subsets of layers being distinguished by a modification of layers to exhibit different resonant frequencies; and a bridge structure comprising two of the at least one acoustic resonator coupled electrically to two of the integrated capacitors.

* * * * *